United States Patent
Fuji et al.

(10) Patent No.: US 8,542,466 B2
(45) Date of Patent: Sep. 24, 2013

(54) MAGNETO-RESISTANCE EFFECT ELEMENT, AND METHOD FOR MANUFACTURING THE SAME

(71) Applicants: Kabushiki Kaisha Toshiba, Tokyo (JP); TDK Corporation, Tokyo (JP)

(72) Inventors: Yoshihiko Fuji, Tokyo (JP); Hideaki Fukuzawa, Tokyo (JP); Hiromi Yuasa, Tokyo (JP); Kunliang Zhang, Milpitas, CA (US); Min Li, Milpitas, CA (US); Michiko Hara, Tokyo (JP); Yoshinari Kurosaki, Tokyo (JP)

(73) Assignees: Kabushiki Kaisha Toshiba, Tokyo (JP); TDK Corporation, Tokyo (JP)

( * ) Notice: Subject to any disclaimer, the term of this patent is extended or adjusted under 35 U.S.C. 154(b) by 0 days.

(21) Appl. No.: 13/740,983

(22) Filed: Jan. 14, 2013

(65) Prior Publication Data
US 2013/0128391 A1 May 23, 2013

Related U.S. Application Data

(63) Continuation of application No. 12/073,895, filed on Mar. 11, 2008, now Pat. No. 8,379,351.

(30) Foreign Application Priority Data

Mar. 30, 2007 (JP) ................. P2007-094474

(51) Int. Cl.
*G11B 5/39* (2006.01)
(52) U.S. Cl.
USPC .............. 360/324.12; 360/324.11; 360/324.1

(58) Field of Classification Search
USPC .............. 360/324–324.2; 257/421; 365/158, 365/171, 173
See application file for complete search history.

(56) References Cited

U.S. PATENT DOCUMENTS

| | | | |
|---|---|---|---|
| 5,304,975 A | 4/1994 | Saito et al. |
| 5,313,186 A | 5/1994 | Schuhl et al. |
| 5,448,515 A | 9/1995 | Fukami et al. |
| 5,459,687 A | 10/1995 | Sakakima et al. |
| 5,549,978 A | 8/1996 | Iwasaki et al. |
| 5,617,071 A | 4/1997 | Daughton |

(Continued)

FOREIGN PATENT DOCUMENTS

| | | |
|---|---|---|
| CN | 1595678 | 3/2005 |
| JP | 2002-208744 | 7/2002 |

(Continued)

OTHER PUBLICATIONS

Translation of Japanese Office Action issued for corresponding Japanese Patent Application No. 2007-094474, mailed Sep. 27, 2011 (translation).

(Continued)

*Primary Examiner* — Will J Klimowicz
(74) *Attorney, Agent, or Firm* — Nixon & Vanderhye P.C.

(57) ABSTRACT

A magneto-resistance effect element, including a fixed magnetization layer of which a magnetization is substantially fixed in one direction, a free magnetization layer of which a magnetization is rotated in accordance with an external magnetic field and which is formed opposite to the fixed magnetization layer, a spacer layer including a current confining layer with an insulating layer and a conductor to pass a current through the insulating layer in a thickness direction thereof, a thin film layer, and a functional layer.

19 Claims, 8 Drawing Sheets

(56) References Cited

U.S. PATENT DOCUMENTS

| | | | |
|---|---|---|---|
| 5,768,181 | A | 6/1998 | Zhu et al. |
| 5,768,183 | A | 6/1998 | Zhu et al. |
| 5,880,911 | A | 3/1999 | Ishihara et al. |
| 6,002,553 | A | 12/1999 | Stearns et al. |
| 6,137,662 | A | 10/2000 | Huai et al. |
| 6,205,008 | B1 | 3/2001 | Gijs et al. |
| 6,341,052 | B2 | 1/2002 | Hayashi |
| 6,400,537 | B2 | 6/2002 | Sakakima et al. |
| 6,452,204 | B1 | 9/2002 | Ishiwata et al. |
| 6,473,275 | B1 | 10/2002 | Gill |
| 6,522,507 | B1 | 2/2003 | Horng et al. |
| 6,603,642 | B1 | 8/2003 | Araki et al. |
| 6,636,391 | B2 | 10/2003 | Watanabe et al. |
| 6,784,509 | B2 | 8/2004 | Yuasa et al. |
| 6,905,780 | B2 | 6/2005 | Yuasa et al. |
| 6,934,132 | B2 | 8/2005 | Hayashi et al. |
| 6,937,446 | B2 | 8/2005 | Kamiguchi et al. |
| 7,046,489 | B2 | 5/2006 | Kamiguchi et al. |
| 7,071,522 | B2 | 7/2006 | Yuasa et al. |
| 7,223,485 | B2 | 5/2007 | Yuasa et al. |
| 7,230,845 | B1 | 6/2007 | Wang et al. |
| 7,268,977 | B2 | 9/2007 | Freitag et al. |
| 7,359,162 | B2 | 4/2008 | Kamiguchi et al. |
| 7,371,587 | B2 | 5/2008 | Drewes et al. |
| 7,514,117 | B2 | 4/2009 | Fukuzawa et al. |
| 7,732,881 | B2 | 6/2010 | Wang |
| 7,800,868 | B2 | 9/2010 | Gao et al. |
| 7,813,088 | B2 | 10/2010 | Tsunekawa et al. |
| 8,379,351 | B2 * | 2/2013 | Fuji et al. ............... 360/324.12 |
| 2001/0002869 | A1 | 6/2001 | Hayashi |
| 2001/0004307 | A1 | 6/2001 | Saito et al. |
| 2002/0044394 | A1 | 4/2002 | Hasegawa |
| 2002/0073785 | A1 | 6/2002 | Prakash et al. |
| 2003/0035256 | A1 | 2/2003 | Hayashi et al. |
| 2003/0063416 | A1 | 4/2003 | Hasegawa |
| 2004/0160810 | A1 | 8/2004 | Deak et al. |
| 2005/0052788 | A1 | 3/2005 | Kamiguchi et al. |
| 2005/0180057 | A1 | 8/2005 | Freitag et al. |
| 2006/0034022 | A1 | 2/2006 | Fukuzawa et al. |
| 2006/0071287 | A1 | 4/2006 | Yuasa et al. |
| 2006/0164764 | A1 | 7/2006 | Kamiguchi et al. |
| 2007/0014149 | A1 | 1/2007 | Nagamine et al. |
| 2007/0047159 | A1 | 3/2007 | Zhao et al. |
| 2007/0154740 | A1 | 7/2007 | Yuasa et al. |
| 2007/0165336 | A1 | 7/2007 | Kamai et al. |
| 2007/0165338 | A1 | 7/2007 | Kamai et al. |
| 2008/0291585 | A1 * | 11/2008 | Yoshikawa et al. ...... 360/324.11 |
| 2009/0091864 | A1 * | 4/2009 | Carey et al. .............. 360/324.11 |
| 2009/0161266 | A1 | 6/2009 | Wang et al. |
| 2009/0257149 | A1 * | 10/2009 | Lee et al. ...................... 360/314 |
| 2010/0037453 | A1 | 2/2010 | Zhang et al. |
| 2010/0304185 | A1 | 12/2010 | Zhao et al. |

FOREIGN PATENT DOCUMENTS

| | | |
|---|---|---|
| JP | 2003-60263 | 2/2003 |
| JP | 2003101100 | 4/2003 |
| JP | 2003-133614 | 5/2003 |
| JP | 2003-204092 | 7/2003 |
| JP | 2005085821 | 3/2005 |
| JP | 2005285936 | 10/2005 |
| WO | 2005/112033 | 11/2005 |

OTHER PUBLICATIONS

H. Yuasa et al.; "Output enhancement of spin-valve giant magnetoresistance in current-perpendicular-to-plane geometry"; 2002 American Institute of Physics; Journal of Applied Physics, vol. 92, No. 5; Sep. 1, 2002.

S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).

Didier Bozec, et al., "Mean Free Path Effects on the Current Perpendicular to the Plane Magnetorisistance of Magnetic Multilayers", Physical Review Letters vol. 85, No. 6, Aug. 7, 2000, pp. 1314-1317. (Abstract).

B. Dieny, et al., "Magnetotransport Properties of Magnetically Soft Spin-Valve Structures (Invited)", J. Appl. Phys., vol. 69 (8), Apr. 15, 1991, pp. 4774-4779. (Abstract).

B. Dieny, et al., "Giant Magnetorisistance of Magnetically Soft Sandwiches: Dependence on Temperature and on Layer Thickness", Physical Review B, vol. 45, No. 2, Jan. 1, 1992, pp. 806-813. (Abstract).

D. Bozec, et al., Comparative Study of Magnetoresistance of MBE-Grown Multilayers: [Fe/Cu/Co/Cu].N and[Fe/Cu]. Nand[Co/Cu].N, Physical Review B., vol. 60, No. 5, Aug. 1, 1999, pp. 3037-3039. (Abstract).

"AP Spin Valve with Improved Signal Using Si in One Pinned Layer for Improved DR/R and Sheet Resistance," IBM TDB, Jan. 2002, UK, Iss. No. 453, p. No. 188, hereinafter AP Spin Valve IBM TDB.

Li et al., "Magnetoresistance Through a Si Interlayer in Spin-Valve Sandwiches," 1999, IEEE, FC-08.

Complete Article (including Figures 1-5) of "AP Spin Valve with Improved Signal Using Si in one Pinned Layer for Improved OR/R and Sheet Resistance," IBM TOB, published Jan. 27, 2002.

* cited by examiner

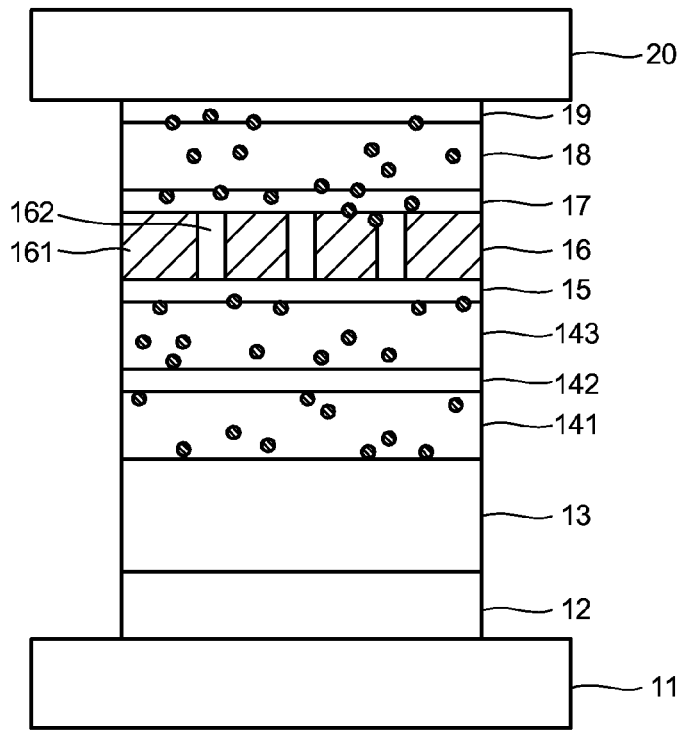
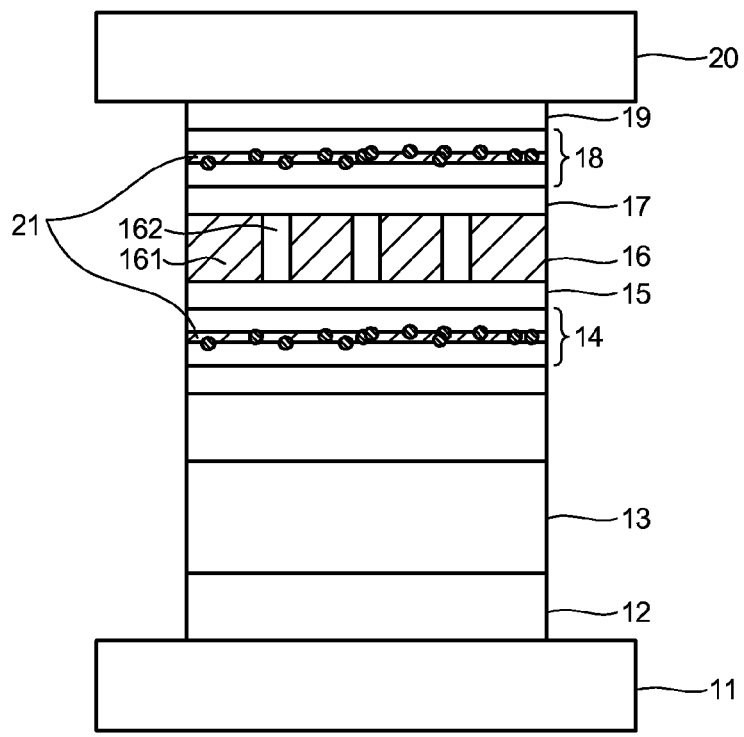

MAGNETO-RESISTANCE EFFECT ELEMENT, AND METHOD FOR MANUFACTURING THE SAME

CROSS-REFERENCE TO RELATED APPLICATIONS

This application is a continuation of U.S. patent application Ser. No. 12/073,895, filed Mar. 11, 2008, now U.S. Pat. No. 8,379,351 B2, and is based upon and claims the benefit of priority from the prior Japanese Patent Application No. 2007-094474, filed on Mar. 30, 2007; the entire contents of which are incorporated herein by reference.

BACKGROUND OF THE INVENTION

1. Field of the Invention

The present invention relates to a magneto-resistance effect element which is configured such that a current is flowed in the direction perpendicular to the film surface thereof to detect the magnetization of the element and the magneto-resistance effect element and to a method for manufacturing the same.

2. Description of the Related Art

Recently, the miniaturization and the high density recording of a hard disk drive (HDD) is remarkably required and being progressed. In the future, it is promised to much develop the high density recording of the HDD. The HDD of high density recording can be realized by narrowing the recording track width. However, the amplitude of the magnetization relating to the recording, that is, the recording signal may be lowered as the track width is narrowed, so that it is required that the reproducing sensitivity of the MR head for reproducing the medium signal is enhanced.

Recently, a GMR (Giant Magneto-Resistance effect) head with a high sensitive spin valve film using the GMR film is employed. The "spin valve" film has such a structure as sandwiching a non-magnetic metal spacer layer between two ferromagnetic layers. The stacking layer component structure exhibiting the change in resistance may be called as a "spin dependent scattering unit". The magnetization of one ferromagnetic layer (often called as a "pinning layer" or "fixed magnetization layer) is fixed by the magnetization of an antiferromagnetic layer and the magnetization of the other ferromagnetic layer (often called as a "free layer" or "free magnetization layer") is rotated in accordance with an external magnetic field. With the spin valve film, the intended large magneto-resistance effect can be obtained when the relative angle between the pinning layer and the free layer is changed.

A conventional spin valve film is formed as a CIP (Current In Plane)-GMR element, a CPP (Current Perpendicular to Plane)-GMR element and a TMR (Tunneling Magneto-Resistance) element. With the CIP-GMR element, a sense current is flowed along the film surface of the spin valve film. With the CPP-GMR element or the TMR element, a sense current is flowed in the direction perpendicular to the film surface thereof.

With the element which is utilized by flowing the sense current in the direction perpendicular to the film surface, the spacer layer is made of an insulating layer in the TMR element and of a metallic layer in the CPP-GMR element.

Herein, a metal CPP-GMR element of which the spin valve film is made of a metallic layer has a smaller change in resistance to render the detection of small magnetic field difficult. In this point of view, in References 1 and 2, such an attempt is made as inserting a layer made of at least one selected from the group consisting of Cr, V, Ta, Nb, Sc, Ti, Mn, Cu, Zn, Ga, Ge, Zr, Hf, Y, Tc, Re, Ru, Rh, Ir, Pd, Pt, Ag, Au, B, Al, In, C, Si, Sn, Ca, Sr, Ba, O, N and F in the fixed magnetization layer of the free magnetization layer composing the spin dependent scattering unit, thereby enhancing the variation ratio in resistance of the CPP-GMR element and thus, thereby enhancing the magneto-resistance effect of the CPP-GMR element.

On the other hand, a CPP element with an oxide layer containing current confining paths in the thickness direction thereof, which is called as an "NOL (nano-oxide layer)", is proposed (refer to Reference 3). With the CPP element, both of the element resistance and the MR ratio can be increased due to the current confined path (CCP) effect. Hereinafter, the element is called as a "CCP-CPP element".

[Reference No. 1] JP-A 2003-133614 (KOKAI)
[Reference No. 2] JP-A 2003-60263A (KOKAI)
[Reference No. 3] JP-A 2002-208744 (KOKAI)

In the CCP-CPP element, it is required to much enhance the sensitivity of the CCP-CPP element. The sensitivity can be defined as the MR ratio.

BRIEF SUMMARY OF THE INVENTION

An aspect of the present invention relates to a magneto-resistance effect element, comprising: a fixed magnetization layer of which a magnetization is substantially fixed in one direction; a free magnetization layer of which a magnetization is rotated in accordance with an external magnetic field and which is formed opposite to the fixed magnetization layer; a spacer layer including a current confining layer with an insulating layer and a conductor to pass a current through the insulating layer in a thickness direction thereof and which is located between the fixed magnetization layer and the free magnetization layer; a thin film layer which is located in a side opposite to the spacer layer relative to the free magnetization layer; and a functional layer containing at least one element selected from the group consisting of Si, Mg, B, Al which is formed in or on at least one of the fixed magnetization layer, the free magnetization layer and the thin film layer.

In the aspect, with a bottom type spin valve film, the functional layer containing at least one element selected from the group consisting of Si, Mg, B, Al is formed at at least one of the fixed magnetization layer, the free magnetization layer and the cap layer, and with a top type spin valve film, the functional layer is formed at at least one of the fixed magnetization layer, the free magnetization layer and the underlayer. The functional layer, as described later, may capture the excess oxygen remaining in spin dependent scattering unit and prevent the diffusion of the excess oxygen so as to prevent the deterioration of the spin dependent scattering due to the interface and inside of the free magnetization layer. Then, since the functional layer contains an element with smaller atomic number such as Si, Mg, B, Al, the spin polarization of each conduction electron is not diminished in the functional layer.

Also, the functional layer may prevent the diffusion of Mn and the like contained in the fixed magnetization layer and the diffusion of Ni and the like contained in the free magnetization layer, leading to the prevention of the deterioration of the spin dependent interface scattering due to the Ni and the like. Particularly, if the free magnetization layer exhibits bcc-structure, the structure of the free magnetization layer can be stable due to the functional layer. Accordingly, the MR ratio of the magneto-resistance effect element, that is, the CCP-CPP element can be enhanced by the synergy effect of three functions as described above.

The three functions are originated purely from the consideration of the inventors so as not to affect the present invention. The present invention is characterized in that the MR is enhanced by the functional layer satisfying the above-described requirements.

In an embodiment of the present invention, the spacer layer includes a metallic layer, e.g., containing at least one element selected from the group consisting of Cu, Ag, Au, formed so as to be adjacent to the current confining layer and at least one of the fixed magnetization layer and the free magnetization layer. If the metallic layer is formed between the current confining layer and the fixed magnetization layer, the metallic layer functions as a supplier for the current confining path of the current confining layer and a protective layer for an oxide, a nitride and an oxynitride contained in the current confining layer against the fixed magnetization layer. If the metallic layer is formed between the current confining layer and the free magnetization layer, the metallic layer functions as a protective layer for an oxide, a nitride and an oxynitride contained in the current confining layer against the fixed magnetization layer.

According to the aspects of the present invention can be provided a magneto-resistance effect element, that is, a CCP-CPP element which can enhance the MR ratio. Then, according to the aspects of the present invention can be provided a magnetic head with good reproducing characteristics, a magnetic disk device and a magnetic memory which utilize the CCP-CPP element.

BRIEF DESCRIPTION OF THE SEVERAL VIEWS OF THE DRAWINGS

FIG. 2A relates to an explanatory view for the enhancement of the MR effect by the insertion of a functional layer in the magneto-resistance effect element in FIG. 1.

FIG. 2B also relates to an explanatory view for the enhancement of the MR effect by the insertion of a functional layer in the magneto-resistance effect element in FIG. 1.

DETAILED DESCRIPTION OF THE INVENTION

Hereinafter, the present invention will be described
(Magneto-Resistance Effect Element)

Figure 1:
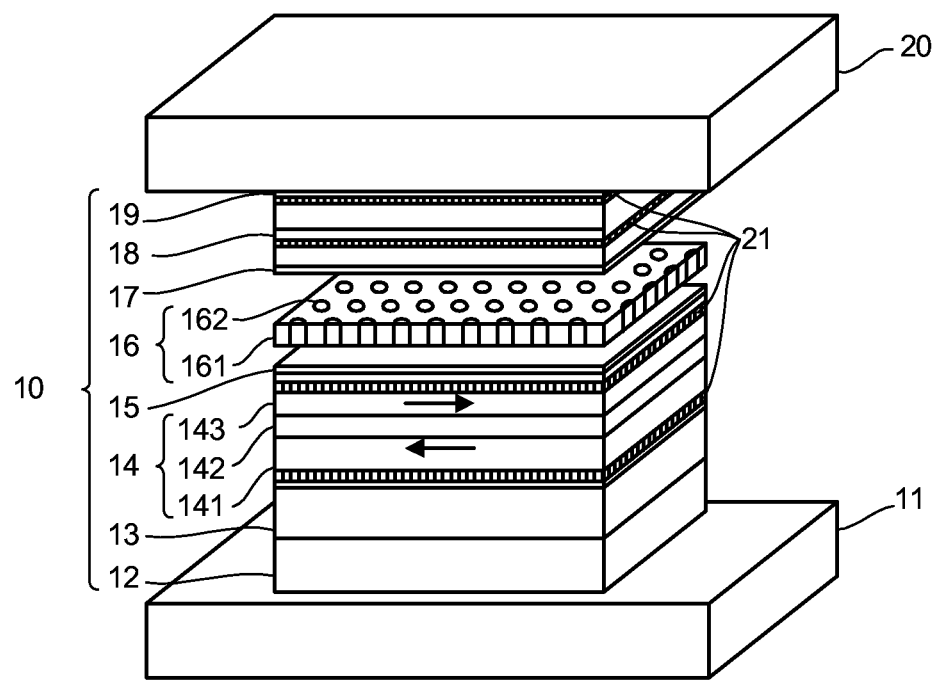
FIG. 1 is a perspective view illustrating an embodiment of the magneto-resistance effect element according to the present invention.

FIG. 1 is a perspective view illustrating a magneto-resistance effect element (CCP-CPP type element) according to an embodiment of the present invention. Some or all components throughout the drawings in the present application are schematically illustrated so that the illustrated thickness ratio for the components is different from the real thickness ratio for the components.

The magneto-resistance effect element illustrated in FIG. 1 includes a magneto-resistance effect element 10, a top electrode 11 and a bottom electrode 20 which are disposed so as to sandwich the magneto-resistance effect element 10. Herein, the illustrated stacking structure is formed on a base (not shown).

The magneto-resistance effect element 10 includes an underlayer 12, a pinning layer 13, a pinned layer 14, a bottom metallic layer 15, a current confining layer 16 (an insulating layer 161 and a current confining path 162), a top metallic layer 17, a free layer 18 and a cap layer 19 which are subsequently stacked and formed. Among them, the top metallic layer 15, the current confining layer 16 and the top metallic layer 17 constitute the spacer layer. Then, the pinned layer 14, the bottom metallic layer 15, the current confining layer 16, the top metallic layer 17 and the free layer 18 constitute a spin dependent scattering unit (spin valve film) which is configured such that the non-magnetic spacer layer is sandwiched between the two ferromagnetic layers. For clarifying the structural feature of the magneto-resistance effect element, the current confining layer 16 is represented under the condition that the current confining layer 16 is separated from the upper and lower layers (the bottom metallic layer 15 and the top metallic layer 17). Then, the components of the magneto-resistance effect element will be described.

<Electrode>

The bottom electrode 11 functions as an electrode for flowing a current in the direction perpendicular to the spin valve film. In real, the current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently.

The top electrode 20 also functions as an electrode for flowing a current in the direction perpendicular to the spin valve film in the same manner as the bottom electrode 11. In real, the current can be flowed through the spin valve film in the direction perpendicular to the film surface thereof by applying a voltage between the bottom electrode 11 and the top electrode 20. The top electrode can be made of a material with low resistance such as Cu, Au.

<Underlayer>

The underlayer 12 may be composed of a buffer layer 12a and a seed layer 12b. The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 1 to 10 nm, more preferably set within 2 to 5 nm. If the buffer layer 12a is formed too thin, the buffer layer 12a can exhibit the inherent buffering effect. If the buffer layer 12a is formed too thick, the Series resistance not contributing to the MR is increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer (s) to be formed thereon. For example, the seed layer 12b may be made preferably of a metallic layer with a fcc-structure (face-centered cubic structure), a hcp-structure (hexagonal close-packed structure) or a bcc-structure (body-centered cubic structure).

Concretely, the seed layer 12b may be made of Ru with hcp-structure or NiFe with fcc-structure so that the crystalline orientation of the spin valve film to be formed thereon can be rendered an fcc (111) faced orientation. The crystalline orientation of the pinning layer 13 (e.g., made of PtMn) can be rendered an fct (111)-structure (face-centered tetragonal structure)-regulated orientation. If the magnetic layer is made of a fcc-structured metal, the orientation of the magnetic layer can be rendered fcc (111) orientation under good condition. If the magnetic layer is made of a bcc-structured metal, the orientation of the magnetic layer can be rendered bcc (110) orientation.

In order to exhibit the inherent seeding function of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_XFe_{100-X}$: X=90 to 50%, preferably 75 to 85%) layer of a NiFe-based non-magnetic (($(Ni_XFe_{100-X})_{100-Y}X_Y$: X=Cr, V, Nb, Hf, Zr, Mo)) layer. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3 to 5 degrees.

The seed layer 12b functions not only as the enhancement of the crystalline orientation, but also as the control of the crystal grain size of the spin valve film. Concretely, the crystal grain size of the spin valve film can be controlled within a range of 5 to 20 nm so that the fluctuation in performance of the magneto-resistance effect element can be prevented, and thus, the higher MR ratio can be realized even though the magneto-resistance effect element is downsized.

The crystal grain size of the spin valve film can be determined on the crystal grain size of the layer formed between the seed layer 12b and the spacer layer 16 by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 20 nm.

Too large crystal grain size may cause the decrease of the number of crystal grain per element surface so as to cause fluctuation in characteristics of the reproducing head. With the CCP-CPP element forming a current confining path, it is not desired to increase the crystal grain size than a prescribed grain size.

In contrast, large crystal grain size may decrease electron irregular reflection at grain boundary or inelastic scattering site. In this point of view, in order to realize the large MR ratio, it is desired to increase the crystal grain size at least up to 5 nm or over. The requirement to realize the large MR ratio is inconsistent with the requirement to realize the prevention of the fluctuation in element characteristics so that the requirement of the large MR ratio satisfies the trade-off relation with the requirement of the prevention of the fluctuation in element characteristics. Therefore, in view of the trade-off relation, the crystal grain size is set preferably within 5 to 20 nm.

In order to set the crystal grain size within 5 to 20 nm, the seed layer 12b may be made of a Ru layer with a thickness of 2 nm or a NiFe-based non-magnetic (($(Ni_XFe_{100-X})_{100-Y}X_Y$: X=Cr, V, Nb, Hf, Zr, Mo, preferably y=0 to 30%)) layer. Too thick seed layer 12b may cause the increase of the Series resistance and rough the interface of the spin valve film. Only if the seed layer 12b can exhibit the inherent performance under the condition that the crystal grain size of the CCP-CPP element can be miniaturized, the seed layer 12b may be made of another material.

<Pinning Layer>

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn, NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer 13 is appropriately controlled. In the case that the pinning layer 13 is made of PtMn or PdPtMn, the thickness of the pinning layer 13 is set preferably within 8 to 20 nm, more preferably within 10 to 15 nm. In the case that the pinning layer 13 is made of IrMn, the unidirectional anisotropy can be applied even though the thickness of the pinning layer 13 of IrMn is set smaller than the thickness of the pinning layer 13 of PtMn. In this point of view, the thickness of the pinning layer 13 of IrMn is set preferably within 4 to 18 nm, more preferably within 5 to 15 nm. In a preferred embodiment, the thickness of the IrMn pinning layer 13 is set to 7 nm.

The pinning layer 13 may be made of a hard magnetic layer instead of the antiferromagnetic layer. For example, the pinning layer 13 may be made of CoPt (Co=50 to 85%), $(CoPt_{100-X})_{100-Y}Cr_Y$: X=50 to 85%, Y=0 to 40%) or FePt (Pt=40 to 60%). Since the hard magnetic layer has a smaller specific resistance, the Series resistance and the area resistance RA of the element can be reduced.

<Pinned Layer: Fixed Magnetization Layer>

The pinned layer (fixed magnetization layer) 14 is formed as a synthetic pinned layer composed of the bottom pinned layer 141 (e.g., $Co_{90}Fe_{10}$ 3.5 nm), the magnetic coupling layer 142 (e.g., Ru) and the top pinned layer 143 (e.g., $Fe_{50}Co_{50}$ 1 nm/Cu 0.25 nm×2/$Fe_{50}Co_{50}$ 1 nm). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes antiparalleled to the direction of magnetization in the top pinned layer 143.

The bottom pinned layer 141 may be made of $Co_XFe_{100-X}$ alloy (X=0 to 100), $Ni_XFe_{100-X}$ (X=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (Bs·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of $Fe_{50}Co_{50}$ 1 nm/Cu 0.25 nm×2/$Fe_{50}Co_{50}$ 1 nm is employed, the magnetic thickness of the top pinned layer 143 is set to 2.2 T×3 nm=6.6 Tnm because the saturated magnetization of the top pinned layer 143 is about 2.2 T. When the bottom pinned layer 141 of $Co_{90}Fe_{10}$ is employed, the thickness of the bottom pinned layer 141 is set to 6.6 Tnm/1.8 T=3.66 nm for the magnetic thickness of 6.6 Tnm because the saturated magnetization of $Co_{90}Fe_{10}$ is about 1.8 T. In this point of view, it is desired that the thickness of the bottom pinned layer 141 made of $Co_{90}Fe_{10}$ is set to about 3.6 nm. When the bottom pinned layer 141 of $Co_{75}Fe_{25}$ is employed, it is desired that the thickness of the bottom pinned layer 141 is set to about 3.3 nm on the same calculation.

The thickness of the bottom pinned layer 141 is preferably set within 2 to 5 nm in view of the magnetic strength of the unidirectional anisotropy relating to the pinning layer 13 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR ratio because the thickness of the top pinned layer 143 is also decreased. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{75}Fe_{25}$ layer with a thickness of 3.3 nm.

The magnetic coupling layer 142 (e.g., Ru layer) causes the antiferromatic coupling between the bottom pinned layer 141 and the top pinned layer 143 which are located under and above the magnetic coupling layer 142, thereby constituting the synthetic pinned structure. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. With the thickness range of the first peak of RKKY, the magnetic coupling layer 142 can exhibit an extremely large antiferromagnetic fixing strength, but the allowable thickness range of the magnetic coupling layer 142 is reduced. In a preferred embodiment, the magnetic coupling layer 142 may be made of the Ru layer with a thickness of 0.9 nm so as to realize the antiferromagnetic coupling for the pinned layers stably.

The top pinned layer 143 may be made of $Fe_{50}Co_{50}$ 1 nm/Cu 0.25 nm×2/$Fe_{50}Co_{50}$ 1 nm. The top pinned layer 143 composes the spin dependent scattering unit. The top pinned layer 143 can contribute directly to the MR effect, and thus, the material and thickness of the top pinned layer 143 are important so as to realize a large MR ratio. The magnetic material of the top pinned layer 143 to be positioned at the interface for the current confining layer 16 is important in view of the contribution of the spin dependent interface scattering.

Then, in the case of the top pinned layer 143 of the $Fe_{50}Co_{50}$ layer with bcc-structure, since the spin dependent interface scattering is enhanced, the MR ratio can be enhanced. As the FeCo-based alloy with bcc-structure, a $Co_XFe_{100-X}$ alloy (X=30 to 100) or a similar CoFe-based alloy containing an additive element can be exemplified. Among them, a $Fe_{40}Co_{60}$ alloy through a $Fe_{80}Co_{20}$ alloy may be employed in view of the above-described requirements.

In the case that the top pinned layer 143 is made of the magnetic layer with bcc-structure easily exhibiting the large MR ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 can not maintain the bcc-structure thereof stably so as not to obtain the large MR ratio.

Herein, the top pinned layer 143 is made of the $Fe_{50}Co_{50}$ layers and the extremely thin Cu layers. The total thickness of the $Fe_{50}Co_{50}$ layers is 3 nm and each Cu layer is formed on the corresponding $Fe_{50}Co_{50}$ layer with a thickness of 1 nm. The thickness of the Cu layer is 0.25 nm and the total thickness of the top pinned layer 143 is 3.5 nm.

The MR ratio becomes large as the thickness of the top pinned layer 143 is increased. In contrast, the pinning magnetic field becomes large as the thickness of the top pinned layer 143 is increased. Therefore, the MR ratio and the pinning magnetic field satisfies the trade-off relation one another. For example, if the top pinned layer is made of an FeCo alloy layer with bcc-structure is employed, the thickness of the top pinned layer is set preferably to 1.5 nm or over so as to realize the large MR ratio. In contrast, the thickness of the top pined layer is set to preferably to 5 nm or below, more preferably to 4 nm or below. As a result, the preferable thickness range of the top pinned layer 143 is set preferably within 1.5 to 5 nm, more preferably within 2 to 4 nm.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one element selected from the group consisting of Co, Fe, Ni. In view of the large MR ratio of the top pinned layer 143, the FeCo alloy with the bcc-structure, the Co alloy containing Co element of 50% or over and the Ni alloy containing Ni element of 50% or over are in turn preferable.

The top pinned layer 143 may be made of a Heusler alloy such as $Co_2MnGe$, $CoMnSi$, $Co_2MnAl$.

In this embodiment, the top pinned layer 143 is made of the magnetic layers (FeCo layers) and the non magnetic layers (extremely thin Cu layers) which are alternately stacked respectively. In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non-magnetic layer will be described. With the CCP-CPP element, since a current is confined in the vicinity of the current confining layer 16, the resistance in the vicinity of the current confining layer 16 contributes the total resistance of the magneto-resistance effect element. Namely, the resistance at the interface between the current confining layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the current confining layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR ratio. In view of the development of the spin dependent bulk scattering effect, the thickness of the thin Cu layer is set preferably within 0.1 to 1 nm, more preferably within 0.2 to 0.5 nm. Too thin Cu layer can not develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.4 nm.

The non-magnetic layer sandwiched by the magnetic layers may be made of Hf, Zr, Ti instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_XCo_{100-X})_{100-Y}Cu_Y$: X=30 to 100% Cr, Y=3 to 15%), but set to another composition range. The third element to be added to the main composition of FeCo may be selected from Hf, Zr, Ti instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

In this embodiment, as shown in FIG. 1, the functional layers 21 made of Si, Mg, B, Al are inserted (formed) into the bottom pinned layer 141 and the top pinned layer 143. The functional layer 21 can exhibit a different function from the enhancement of spin dependent bulk scattering effect by the insertion of the non-magnetic layer made of Cu or the like in References 1 and 2. The functional layer 21 can exhibit the large MR ratio only if the functional layer 21 is inserted in the CCP-GMR film of the CCP-CPP element. The functional layer 21 will be described in detail, hereinafter.

In this embodiment, the functional layers 21 are formed in the bottom pinned layer 141 and the top pinned layer 142, but may be formed in either one of the bottom pinned layer 141 and the top pinned layer 142. Then, the functional layer(s) 21 may be formed at the interface between the top pinned layer 143 and the bottom metallic layer of the spacer layer, for example. Then, the functional layer (s) 21 may be formed in the free layer and/or <Spacer Layer>

Then, the spacer layer will be concretely described. The bottom metallic layer 15 is employed for the formation of the current confining path 162 and thus, functions as a supplier for the current confining path 162. It is not required that the metallic layer 15 remains as it is apparently after the formation of the current confining path 162. In this point of view, the bottom metallic layer 15 functions broadly as a part of the spacer layer. The bottom metallic layer 15 functions as a stopper layer preventing the oxidization of the magnetic layer 143 which is located below the current confining layer 16 in the formation of the current confining layer 16.

When the current confining path 162 is made of Cu, the bottom metallic layer 15 is made preferably of the same material, Cu. When the current confining path 162 is made of a magnetic material, the pinned layer 14 may be made of the same magnetic material or a different magnetic material. The current confining path 162 can be made of Au, Ag instead of Cu.

The current confining layer 16 includes the insulating layer 161 and the current confining path 162. The insulating layer 161 is made of oxide, nitride, oxynitride or the like. In order to exhibit the inherent function of the spacer layer, the thickness of the insulating layer 161 is set preferably within 1 to 3 nm, more preferably within 1.5 to 2.5 nm.

The current confining path 162 functions as a path to flow a current in the direction perpendicular to the film surface of the current confining layer 16 and then, confining the current. The current confining path 162 also functions as a conductor to flow the current in the direction perpendicular to the film surface of the insulating layer 161 and is made of a metal such as Cu. In other words, the spacer layer 16 exhibits the current-confined path structure (CCP structure) so as to enhance the MR ratio from the current confining effect. The current confining path 162 (CCP) may be made of Au, Ag, Ni, Co, Fe or an alloy containing at least one from the listed elements instead of Cu. In a preferred embodiment, the current confining path 162 is made of a Cu alloy. The current confining path 162 may be made of an alloy layer of CuNi, CuCo or CuFe. Herein, the content of Cu in the alloy is set preferably to 50% or over in view of the enhancement of the MR ratio and the reduction of the interlayer coupling field, Hin (interlayer coupling field) between the pinned layer 14 and the free layer 18.

The content in oxygen and nitrogen of the current confining path 162 is much smaller than (at least half as large as) the one of the insulating layer 161. The current confining path 162 is generally crystallized. Since the resistance of the crystalline phase is smaller than the resistance of the non-crystalline phase, the current confining path 162 can easily conduct the inherent function.

The top metallic layer 17 functions as a barrier layer protecting the oxidization of the free layer 18 to be formed thereon through the contact with the oxide of the current confining layer 16 so that the crystal quality of the free layer 18 cannot be deteriorated. Concretely, the top metallic layer 17 protects the free layer 18 to be formed thereon so as not to suffer from the oxidizing and nitriding through the contact with the oxide, nitride and/or oxynitride of the current confining layer 16. Namely, the top metallic layer 17 prevents the direct contact of the oxygen contained in the oxide of the current confining path 162 with the free layer 18. Then, when the insulating layer 161 is made of an amorphous material (e.g., $Al_2O_3$), the crystal quality of a metallic layer to be formed on the layer 161 may be deteriorated, but when an extremely thin layer (e.g., Cu layer) to develop the crystal quality of fcc-structure is provided, the crystal quality of the free layer 18 can be remarkably improved.

It is desired that the top metallic layer 17 is made of the same material (e.g., Cu) as the current confining path 162 of the current confining layer 16. If the top metallic layer 17 is made of a different material from the current confining path 162, the resistance at the interface between the top metallic layer 17 and the current confining path 162 is increased, but if the top metallic layer 17 is made of the same material from the current confining path 162, the resistance at the interface between the top metallic layer 17 and the current confining path 162 is not increased. When the current confining path 162 is made of a magnetic material, the pinned layer 14 may be made of the same magnetic material or a different magnetic material. The current confining path 162 can be made of Au, Ag instead of Cu.

<Free Layer: Free Magnetization Layer>

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$ 3.5 nm. In order to realize the large MR ratio, it is desired to provide the CoFe alloy instead of the NiFe alloy. Then, in order to realize the large MR ratio, the selection of magnetic material of the free layer 18 in the vicinity of the spacer 16, that is, at the interface therebetween is important. The free layer 18 may be made of a single $Co_{90}Fe_{10}$ layer with a thickness of 4 nm without a NiFe layer or a triple-layered structure of CoFe/NiFe/CoFe. As described below, the free layer 18 may partially composes an amorphous alloy layer made of CoZrNb.

Among CoFe alloys, the $Co_{90}Fe_{10}$ layer is preferably employed in view of the stable soft magnetic property. If a CoFe alloy similar to the $Co_{90}Fe_{10}$ alloy in composition is employed, it is desired that the thickness of the resultant CoFe alloy layer is set within 0.5 to 4 nm. Moreover, the free layer 18 may be made of $Co_xFe_{100-x}$ (X=70 to 90%).

Then, the free layer 18 is made of an alternately stacking structure of CoFe layers or Fe layers with a thickness of 1 to 2 nm and extremely thin Cu layers with a thickness of 0.1 to 0.8 nm.

In the case that the current confining layer 16 is made of the Cu layer, it is desired that the FeCo layer with bcc-structure is employed as the interface material thereof for the spacer layer 16 so as to enhance the MR ratio in the same manner as the pinned layer 14. As the FeCo layer with bcc-structure, the $Fe_xCo_{100-x}$ (X=30 to 100) or, as occasion demands, containing a third additive element, may be employed. In a preferred embodiment, a $Co_{90}Fe_{10}$ 1 nm/$Ni_{83}Fe_{17}$ 3.5 nm may be employed. Instead of the FeCo layer with bcc-structure, a CoFe layer with fcc-structure may be employed.

The free layer 18 may partially composes an amorphous alloy layer made of CoZrNb. In this case, it is required that the portion of the free layer 18 adjacent to the spacer layer 16 is made of a crystalline magnetic layer. The free layer 18 may be structured as (1) a single crystal layer, (2) a stacking structure of crystal layer/amorphous layer and (3) a stacking structure of crystal layer/amorphous layer/crystal layer, as viewed from the spacer layer 16. In these cases (1) to (3), it is important that the crystal layer of the free layer 18 is always contacted with the spacer layer 16.

In this embodiment, as shown in FIG. 1, the functional layer 21 containing Si, Mg, B, Al is inserted (formed) in the free layer 18. The functional layer 21 can exhibit a different function from the enhancement of spin dependent bulk scattering effect by the insertion of the non-magnetic layer made of Cu or the like in References 1 and 2 as described above (in pinned layer). The functional layer 21 can exhibit the large MR ratio only if the functional layer 21 is inserted in the CCP-GMR film of the CCP-CPP element. The functional layer 21 will be described in detail, hereinafter.

In this embodiment, the functional layer 21 is formed in the free layer 18, but may be formed on the free layer 18 or at the interface between the free layer 18 and the top metallic layer 17 of the spacer layer, for example. Then, the functional layer(s) 21 may be formed in the free layer and/or cap layer as described below.

<Cap Layer>

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the metallic layer because the kind of material of the cap layer may change the MR ratio and the long reliability. In view of the stable MR ratio and long reliability, the Cu layer and/or the Ru layer is preferable for the cap layer.

In this embodiment, as shown in FIG. 1, the functional layer 21 containing Si, Mg, B, Al is inserted (formed) in the cap layer 19. The functional layer 21 can exhibit a different function from the enhancement of spin dependent bulk scattering effect by the insertion of the non-magnetic layer made of Cu or the like in References 1 and 2 as described above (in pinned layer). The functional layer 21 can exhibit the large MR ratio only if the functional layer 21 is inserted in the CCP-GMR film of the CCP-CPP element. The functional layer 21 will be described in detail, hereinafter.

In this embodiment, the functional layer 21 is formed in the cap layer 19, but may be formed on the cap layer 19, that is, between the free layer 18 and the cap layer 19, for example. Then, the functional layer (s) 21 may be formed in the pinned layer and/or free layer as described above.

In this embodiment, by inserting the functional layer (s) 21 containing at least one element selected from the group consisting of Si, Mg, B, Al into at least one of the bottom pinned layer 141, the top pinned layer 143, the free layer 18 and the cap layer 19, the MR ratio of the magneto-resistance effect element (CCP-CPP element) in FIG. 1 can be enhanced. In References 1 and 2, an intermediate layer similar to the functional layer is formed in the CCP-CPP element, thereby enhancing the MR ratio of the CCP-CPP element through the enhancement of the spin dependent bulk scattering. In this embodiment, however, the enhancement of the MR ratio relating to the functional layer is not originated from the enhancement of spin dependent bulk scattering.

The inventors found out that if the functional layer made of Si is inserted in at least one of the bottom pinned layer 141, the top pinned layer 143, the free layer 18 and the cap layer 19, the MR ratio of the magneto-resistance effect element in FIG. 1 is enhanced. One concrete film structure of the magneto-resistance effect element exhibiting the enhancement of the MR ratio will be described below.

| | |
|---|---|
| Bottom electrode 11 | |
| Underlayer 12 | Ta 5 nm/Ru 2 nm |
| Pinning layer 13 | $Ir_{22}Mn_{78}$ 7 nm |
| Pinned layer 14 | $Co_{75}Fe_{25}$ 3.3 nm/Ru 0.9 nm/ $Fe_{50}Co_{50}$ 1 nm/Cu 0.25 nm × 2/$Fe_{50}Co_{50}$ 1 nm |
| Metallic layer 15 | Cu 0.6 nm |
| Current confining layer 16 | Insulating layer 161 of $Al_2O_3$ and current confining path 162 of Cu |
| Metallic layer 17 | Cu 0.4 nm |
| Free layer 18 | $Co_{60}Fe_{40}$ 2 nm/Si 0.25 nm/ $Ni_{83}Fe_{17}$ 3.5 nm |
| Cap layer 19 | Cu 1 nm/Ta 2 nm/Ru 15 nm |
| Top electrode 20 | |

In the CCP-GMR film of the above-listed film structure, the MR ratio was 11%. If the free layer 18 is made of $Co_{40}Fe_{60}$ 2 nm/$Ni_{83}Fe_{17}$ 3.5 nm without the functional layer, the MR ratio was 9.5%. As a result, by inserting the Si layer into the free layer 18 of the CCP-GMR film, it was confirmed that the MR ratio is enhanced by 1.5%.

In the film structure, it was confirmed that the insertion of the Si functional layer into the free layer 18 can enhance the MR ratio. Similarly, it was confirmed that the insertion of the Si functional layer into the cap layer 19 and the pinned layer 14 can enhance the MR ratio. The detail explanation will be done in Examples.

Herein, the reason of the enhancement of the MR ratio of the magneto-resistance effect element in this embodiment will be described. At present, the mechanism to develop the MR ratio may not be fully recognized.

A. Discussion for the mechanism relating to the enhancement of the MR ratio of the magneto-resistance effect element through the insertion of the functional layer. First of all, it is considered that the enhancement of the MR ratio and the reliability is originated from the capturing effect of excess oxygen. FIG. 2A relates to a cross sectional view of a conventional CCP-GMR film without a functional layer. In FIG. 2A, since the insulating layer 161 is made of $Al_2O_3$, the excess oxygen generated when the $Al_2O_3$ is formed is diffused into the pinned layer 14 and the free layer 18.

When the excess oxygen is diffused into the pinned layer 14 and the free layer 18, the excess oxygen may oxidize the magnetic constituent elements such as Co, Fe, Ni. If the CoO, FeO or NiO are formed in the pinned layer 14 and the free layer through the oxidation, the spin dependent bulk scattering may be deteriorated. Moreover, if the CoO, FeO or NiO are formed at the interface between the pinned layer 14 and the bottom metallic layer 15 and at the interface between the top metallic layer 17 and the free layer 18, the spin dependent interface scattering may be deteriorated. The reduction of the spin dependent bulk scattering and the spin dependent interface scattering causes the reduction of the MR ratio. In this point of view, a conventional CCP-GMR film can not exhibit the inherent GMR effect sufficiently and in order to mount the CCP-GMR film at a magnetic head for high density recording magnetic recording device, it is effective to prevent the diffusion of the excess oxygen from the insulating layer 162.

FIG. 2B relates to a cross sectional view of the CCP-GMR film with a functional layer inserted therein. In FIG. 2B, the Si functional layer 21 is inserted into the top pinned layer 143. Table 1 lists various element oxide formation energies. In Table 1, the element with lower oxide formation energy means an element likely to be oxidized. Referring to Table 1, elemental Si is likely to be oxidized in comparison with Co, Fe, Ni. Therefore, the excess oxygen from the free layer 18 and the pinned layer 14 is shifted to the Si functional layer 21 so that the elemental Si is oxidized and the elemental Co, Fe, Ni are (is) reduced. Therefore, by inserting the Si functional layer into the top pinned layer 143 and the free layer 18, the formation of CoO, FeO and NiO can be prevented so that the spin dependent bulk scattering and the spin dependent interface scattering can not be deteriorated. As a result, the CCP-GMR film can exhibit the inherent GMR effect sufficiently.

TABLE 1

| | Element | Oxide | Oxide formation free energy $\{\times 10^{-6} \text{ J/kmol}\}$ |
|---|---|---|---|
| Metal pass material | Cu | CuO | −127 |
| Magnetic material | Co | CoO | −213 |
| | Ni | NiO | −216 |
| | Fe | FeO | −244 |
| Examples of element with higher oxygen affinity than magnetic material | Mo | $MoO_2$ | −502 |
| | Mg | MgO | −573 |
| | V | $VO_2$ | −680 |
| | W | $WO_3$ | −763 |
| | Si | $SiO_2$ | −805 |
| | Ti | $TiO_2$ | −880 |
| | Zr | $ZrO_2$ | 1037 |
| | Cr | $Cr_2O_3$ | −1048 |
| | Hf | $HfO_2$ | −1084 |
| | B | $B_2O_3$ | −1170 |
| | Al | $Al_2O_3$ | −1580 |
| | Ta | $Ta_2O_5$ | −1970 |

In order to realize the enhancement of the MR ratio, it is required that the element to be employed for the functional layer is appropriately selected. As is apparent from Table 1, there are many elements likely to be oxidized in comparison with Co, Fe Ni in addition to Si. For example, if the Ta or Hf functional layer is inserted into the pinned layer 14 or the free layer 18, the Ta or Hf functional layer can exhibit the excess oxygen-capturing function in the same manner as the Si functional layer. With the Ta or Hf functional layer, however, the spin-polarized conduction electrons may bring about some scatterings of no spin-dependent through the spin orbit interaction at the Ta or Hf functional layer. In other words, even though the Ta or Hf functional layer captures the excess oxygen so that the CPP-GMR film can exhibit the inherent GMR effect sufficiently, the spin-polarized conduction electrons can not reach the magnetic layer effectively and efficiently because the conduction electrons lose the inherent spin polarization at the Ta or Hf layer. As a result, the CPP-GMR film can not exhibit the inherent GMR effect, resulting in the reduction of the MR ratio.

In contrast, since the elemental Si, the Si functional layer being able to exhibit the enhancement of the MR effect, is an element of smaller atomic number, with the Si functional layer, the spin-polarized conduction electrons may not bring about some scatterings of no spin-dependent through the spin orbit interaction in comparison with the Ta or Hf functional layer. As a result, the Ta or Hf functional layer may not reduce the GMR effect of the CPP-GMR element in view of the spin polarization. In this way, since the Si functional layer may not bring about the scattering of no spin-dependent and may capture the excess oxygen, the Si functional layer can enhance the MR ratio of the CCP-GMR film. According to the above-described discussion, as an element likely to be oxidized in comparison with Co, Fe and Ni, Mg, B and Al may be exemplified. It may be, therefore, that the Mg, B or Al functional layer can enhance the MR ratio of the CCP-GMR film through the capture of the excess oxygen.

It is also considered that the enhancement of the MR ratio of the formation of the functional layer is originated from the diffusion preventing effect in addition to the excess oxygen capturing effect. When the Mn elements of the pinning layer 13 and the Ni elements of the top free layer are diffused near the current confining layer, the resistance of the current confining path may be increased and/or the spin dependent interface scattering may be reduced, resulting in the reduction of the MR ratio. In the magneto-resistance effect element, for example, if the Si functional layer is inserted in the top pinned layer 143, the diffusion of the Mn elements contained in the pinning layer 13 can be prevented near the current confining layer 16 so as to enhance the MR ratio of the CPP-GMR film. Moreover, when the free layer 18 is made of $Fe_{40}Co_{60}$ 20 nm/$Ni_{83}Fe_{17}$ 35 nm, if the Si functional layer is formed in a thickness of 0.25 nm between the $Fe_{40}Co_{60}$ layer and the $Ni_{83}Fe_{17}$, the diffusion of the Ni elements contained in the free layer 18 is prevented, resulting in the enhancement of the MR ratio.

Even though the Si functional layer is inserted in the cap layer 19, the MR ratio can be enhanced, which will be referred to Examples, hereinafter. In this case, since the functional layer is not formed between the pinning layer and the current confining layer and between the Ni-containing layer of the free layer and the current confining layer, the functional layer can not exhibit the diffusion preventing function against the Mn elements and the Ni elements. As a result, the diffusion preventing function of the functional layer is not an essential function for the enhancement of the MR ratio.

It is considered that the enhancement of the MR ratio of the functional layer is originated from the stabilization of the bcc-structure of the free layer 18.

When the portion of the free layer 18 in the side of the spacer layer is made of a magnetic material of bcc-structure, the spin dependent interface scattering is increased so as to realize the large MR ratio. In view of the soft magnetic property, it is not desired that the free layer 18 is made of a single layer of $Fe_{50}Co_{50}$ and it is desired that the free layer 18 is made of $Fe_{50}Co_{50}$ 2 nm/$Ni_{90}Fe_{10}$ 3.5 nm. In the latter case, since the $Fe_{50}Co_{50}$ layer is formed thinner, the bcc-structure of the $Fe_{50}Co_{50}$ layer may become unstable because the fcc-structure of the $Ni_{90}Fe_{10}$ layer, which is formed on the $Fe_{50}Co_{50}$ layer, affects the crystallinity of the $Fe_{50}Co_{50}$ layer. In this case, if the Si functional layer with a thickness of 0.25 nm is inserted between the $Fe_{50}Co_{50}$ layer and the $Ni_{90}Fe_{10}$ layer, the Si functional layer cuts off the lattice match between the $Fe_{50}Co_{50}$ layer and the $Ni_{90}Fe_{10}$ layer, allowing the stability of the bcc-structure of the $Fe_{50}Co_{50}$ layer.

As described above, however, even though the Si functional layer is inserted in the cap layer 19, the MR effect can be enhanced, so that the stabilization of the bcc-structure is not an essential function for the enhancement of the MR ratio.

Possibly, the enhancement of the MR ratio of the CCP-GMR film is mainly originated from the capturing effect of the excess oxygen from the spacer layer. When the Si functional layer is formed between the $Fe_{50}Co_{50}$ layer and the $Ni_{90}Fe_{10}$ layer, the enhancement of the MR ratio of the CCP-GMR film may be partially originated from the diffusion preventing effect of the Ni elements and the stabilization of the bcc-structure of the $Fe_{50}Co_{50}$ layer. Anyway, if the functional layer is formed, the MR ratio of the CPP-GMR film can be enhanced.

The functional layer 21 may be made of a material containing an element such as Mg, B, Al with an oxide formation energy lower than Co, Ni, Fe, in addition to Si. Since the non-magnetic functional layer 21 is inserted, the magnetic coupling of the pinned layer 14 or the free layer 18 (that is, between the top magnetic layer and the bottom magnetic layer which are divided by the functional layer) may be divided. In order to maintain the magnetic coupling of the pinned layer 14 and the free layer 18 via the functional layer 21 sufficiently, the thickness of the functional layer 21 is set preferably within 0.05 to 1 nm, more preferably within 0.1 to 0.7 nm.

On the other hand, when the functional layer 21 is formed in the cap layer 19, the thickness of the functional layer 21 can be set larger than in the case of the pinned layer 14 and the free layer 18 because the magnetic coupling is not required to be divided. Therefore, the thickness of the functional layer is set preferably within 0.05 to 3 nm, more preferably within 0.1 to 1 nm. Too thick functional layer may cause the increase of the Series resistance.

In the case that the functional layer 21 is formed in the pinned layer 14 and the free layer 18, the functional layer 21 may be made of a layer mixed with magnetic element such as Co, Ni, Fe and non-magnetic inherent functional element such as Si, Mg, B, Al. For example, in the case that the functional layer is inserted into the free layer 18 of $Fe_{50}Co_{50}$ 2 nm/$Ni_{90}Fe_{10}$ 3.5 nm, the functional layer may be made of $Fe_{50}Co_{50}$ containing additive Si or $Ni_{90}Fe_{10}$ containing additive Si. In this case, since the functional layer contains the magnetic elements and the Si element, the Si elements may be dispersed in the thickness direction of the functional layer so that the capturing efficiency of excess oxygen may be reduced, in comparison with the Si functional layer without the magnetic elements. However, since the functional layer is formed, the enhancement of the MR ratio can be increased to some degrees. Without the functional layer, the enhancement of the MR ratio can not be increased. Moreover, since the functional layer containing the magnetic elements and the Si element is formed, the magnetic coupling of the magnetic layer (that is, the top magnetic layer and the bottom magnetic layer which are divided by the functional layer) can be easily maintained via the functional layer.

Suppose that the Si elements are dispersed entirely in the free layer 18 of FeCo/NiFe, the free layer 18 becomes FeCoSi/NiFeSi. In this case, since the Si elements to capture the excess oxygen are dispersed uniformly in the free layer 18, the capturing effect of the excess oxygen may be diminished because the excess oxygen can not be gather up. In other words, in order to achieve the present invention, it is required that the Si elements are added to the magnetic layer as the functional layer, and not required that the Si elements are added as it is.

It is not desired that the functional layer is formed remote from the spacer layer. If the functional layer is formed remote from the spacer layer, the functional layer can not capture the excess oxygen of the portions of the pinned layer 14 and the free layer 18 in the vicinity of the spacer layer so that the excess oxygen remains in the magnetic layer most contributing the MR effect in the vicinity of the current confining layer 16. In the case that the functional layer 21 is inserted in the pinned layer 14, it is desired that the functional layer 21 is formed in the region remote from the interface between the pinned layer 14 and the spacer layer by 10 nm or below in the direction from the interface therebetween to the pinned layer 14. In the case that the functional layer 21 is inserted in the free layer 18 and the cap layer 19, it is desired that the functional layer 21 is formed in the region remote from the interface between the free layer 18 and the spacer layer by 10 nm or below in the direction from the interface therebetween to the free layer 18.

The functional layers may be formed in the pinned layer 14, the free layer 18 and the cap layer 19. In this case, the layers can be represented as $Fe_{50}Co_{50}$ 2 nm/first functional layer Si 0.25 nm/$Ni_{90}Fe_{10}$ 1.5 nm/second functional layer Si 0.25 nm/$Ni_{90}Fe_{10}$ 1 nm/third functional layer Si 0.25 nm/$Ni_{90}Fe_{10}$ 1 nm. The distance of the first functional layer and the second functional layer is set preferably within 1 to 2 nm, and the distance of the second functional layer and the third functional layer is set preferably within 1 to 2 nm.

If the functional layers are formed, the capturing effect of excess oxygen can be enhanced. The functional layers are formed both of or either of the pinned layer 14 and the free layer 18.

On the other hand, if the functional layers are formed in the magnetic layer, the magnetic coupling of the magnetic layer is reduced so that the magnetic characteristics of the magnetic layer may be deteriorated. In order to prevent the deterioration of the magnetic coupling in the pinned layer 14 or the free layer, the total thickness of the functional layers is preferably set to the thickness of one functional layer. The distance between the adjacent functional layers is set within 1 to 2 nm.

The MR ratio is increased dependent on the kind of material of the magnetic layer. The MR ratio is increased as the Fe composition ratio is increased. One film structure embodiment will be listed below.

| | |
|---|---|
| Bottom electrode 11 | |
| Underlayer 12 | Ta 5 nm/Ru 2 nm |
| Pinning layer 13 | $Ir_{22}Mn_{78}$ 7 nm |
| Pinned layer 14 | $Co_{75}Fe_{25}$ 3.3 nm/Ru 0.9 nm/$Fe_{50}Co_{50}$ 1 nm/Cu 0.25 nm × 2/$Fe_{50}Co_{50}$ 1 nm |
| Metallic layer 15 | Cu 0.6 nm |
| Current confining layer 16 | Insulating layer 161 of $Al_2O_3$ and current confining path 162 of Cu |
| Metallic layer 17 | Cu 0.4 nm |
| Free layer 18 | described later |
| Cap layer 19 | Cu 1 nm/Ta 2 nm/Ru 15 nm |
| Top electrode 20 | |

In comparison of the free layer 18 of Fe—Co 2 nm/Si 0.25 nm/$Ni_{83}Fe_{17}$ 3.5 nm (with the functional layer 21) with the free layer 18 of FeCo 2 nm/$Ni_{83}Fe_{17}$ 3.5 nm (without the functional layer 21), the MR ratio is increased by 0.5% at the Fe composition of 10 at. % at the interface between the free layer 18 and the spacer, and by 1.5% at the Fe composition of 40 at. % thereat, and by 2.2% at the Fe composition of 50 at. % thereat.

It is apparent, therefore, that the MR ratio due to the functional layer is increased as the Fe composition is increased. In this point of view, in the case that the functional layer 21 is inserted in the magnetic layer, it is desired in view of the enhancement of the MR ratio that the Fe composition is set to 10 at % or over in the region remote from the spacer layer by 1 nm or below, preferably to 40 at % or over therein.

The reason the MR ratio is increased as the Fe composition is increased can be considered as follows. The oxide formation energy of Fe is lowest among Co, Fe, Ni. When the pinned layer 14 and the free layer 18 are made of materials with Fe-rich compositions, the pinned layer 14 and the free layer 18 are likely to be oxidized from the excess oxygen of the spacer layer. Therefore, the MR ratio of the CPP-GMR film subject to the excess oxygen becomes lower than the MR ratio of the CPP-GMR film not subject to the excess oxygen. However, in the CPP-GMR film subject to the excess oxygen, the MR ratio can be easily increased by the capturing effect of excess oxygen due to the formation of the Si functional layer. Among Co, Fe, Ni, the oxide formation energy of Fe is lowest and the oxide formation energy of Co is highest. Therefore, the MR ratio in the magnetic layer with higher Fe composition can be increased remarkably by the formation of the functional layer 21 in comparison with the MR ratio in the magnetic layer with higher Ni composition and Co composition.

The structure of the magneto-resistance effect film 10 containing the functional layer therein can be observed by means of a three-dimensional atom probe, e.g., the Local Electrode Atom Probe made by "Imago Scientific Instruments Inc".

According to the three-dimensional atom probe, the composition of the material to be observed can be mapped three-dimensionally in the order of atomic level. Concretely, the sample to be measured is processed in needle shape so that the curvature radius of the forefront of the sample is set within 30 to 100 nm and the length (height) of the sample is set to about 100 μm. Then, a high voltage is applied to the sample so as to evaporate the atoms from the forefront of the sample by means of the electric field generated by the application of the high pulsed voltage, which the evaporated atoms are detected by the two-dimensional detector. The intended three-dimensional (x, y, z) structure can be obtained from the information in the depth (z-axis) direction by following the changes in position information of the atoms in the two dimensional (x, y) plane with time, which the position information of the atoms are detected by the two-dimensional detector.

A three-dimensional atom probe made by "Oxford Instruments Inc." or Cameca Inc. may be employed instead of the three-dimensional atomic force microprobe. The electric field evaporation may be conducted by the application of a laser pulse instead of the pulsed voltage. In both cases, a biasing electric field is applied by means of DC voltage. With the pulsed voltage, the electric field requiring the electric field evaporation can be generated in dependent on the amplitude of the voltage. With the laser pulse, the sample is locally heated by the irradiation of the laser pulse so that the electric field evaporation can be likely to be generated.

The structure of the magneto-resistance effect film 10 containing the functional layer therein can be locally observed by means of element analysis through EDX in the cross sectional TEM image.

Figure 3:
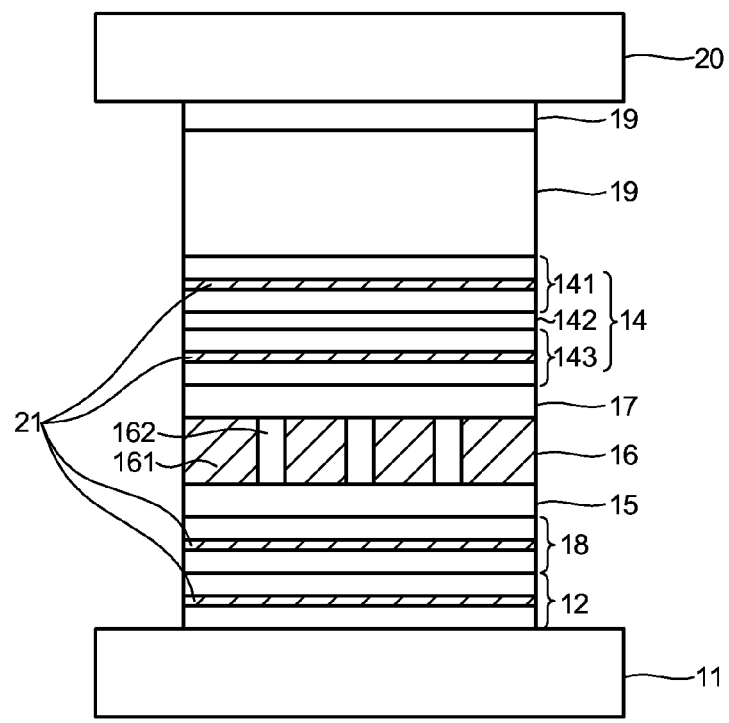
FIG. 3 is a cross sectional view relating to an modified embodiment from the magneto-resistance effect element in FIG. 1.

In this embodiment, as shown in FIG. 1, although the functional layers are applied for the bottom-type CCP-CPP element, the functional layers may be applied for the top-type CCP-CPP element. FIG. 3 relates to a cross sectional view of a top type CCP-CPP element. In this case, the functional layer 21 may be formed in the underlayer 12 instead of the cap layer 19 in the bottom type CCP-CPP element. Then, the CCP-CPP element will be described in comparison with another embodiment.

C. Comparison with a Metal CPP-GMR Film Containing a Si Functional Layer

In the metal CPP-GMR film, by inserting the Cu layer in the magnetic layer, the spin dependent bulk scattering is increased so as to enhance the MR ratio, which is disclosed in "H. Yuasa et al., J. Appl. Phys. 92(5), 2646 (2002)". Then, in the metal CPP-GMR film, by inserting the B, Al or Si layer in the magnetic layer, instead of the Cu layer, the MR ratio is increased which are disclosed in References 1 and 2. Hereinafter, the CCP-CPP film containing the Si functional layer therein will be described in comparison with the metal CPP-GMR film.

In the metal CPP-GMR film, the MR ratio can be enhanced by the formation of the inserting layer originated from the spin bulk scattering effect. Generally, the spin dependent bulk scattering is originated from elemental Cu so that in the metal CPP-GMR film, the MR ratio can be most enhanced by the formation of the Cu layer. Concretely, in the metal CPP-GMR film, the MR ratio from the formation of the Si, B or Al layer is one-fourth as large as the MR ratio from the formation of the Cu layer.

Therefore, in the CCP-GMR film, the spin dependent bulk effect can be enhanced by the formation of the inserting layer. In fact, if the Cu layer is inserted in the top pinned layer 143 so that the structure of the top pinned layer 143 is defined as $Fe_{50}Co_{50}$ 1 nm/Cu 2.5 nm/$Fe_{50}Co_{50}$ 1 nm/Cu 2.5 nm/$Fe_{50}Co_{50}$ 1 nm, the spin dependent bulk scattering effect can be enhanced. However, the MR ratio of the CCP-GMR film is increased by about 1% through the formation of the Cu layer and the MR ratio of the CCP-GMR film is increased by about 1.5% or over through the formation of the Si layer, which is contrary to the case of the metal CPP-GMR film containing the Cu layer and the Si layer therein. Therefore, the cause of the MR enhancement through the formation of the Si layer in the CCP-GMR film is different from the cause of the MR enhancement through the formation of the Si layer in the metal CPP-GMR film so that the large MR enhancement through the formation of the Si layer in the CCP-GMR film is a specific feature.

The reason the MR enhancement effect through the formation of the Si layer in the CCP-GMR film is different from the MR enhancement effect through the formation of the Si layer in the metal CPP-GMR film is originated from that the MR enhancement effect of the CCP-GMR element can be obtained by forming the Si layer in the cap layer. On the other hand, since the MR enhancement effect of the metal CPP-GMR element can not be obtained by forming the Si layer in the cap layer through the spin dependent bulk scattering.

As described above, the cause that the MR of the metal CPP-GMR film through the formation of the Si layer is not increased in comparison with the CCP-GMR film is originated from that in the metal CPP-GMR film, since the excess oxygen does not remain in the magnetic layer without the spacer layer as a supplier of the excess oxygen, the metal CCP-GMR film can exhibit the inherent MR ratio sufficiently through the spin dependent bulk and interface scatterings. In contrast, in the CCP-GMR film, since the excess oxygen remains in the magnetic layer, the CCP-GMR film can not exhibit the inherent MR ratio sufficiently so that in the CCP-GMR film, the MR ratio can be enhanced by the formation of the Si layer under the capturing effect of the excess oxygen. In this case, the spin dependent scattering effect can be recovered.

In this way, by utilizing the capturing effect of the excess oxygen through the Si Mg, B or Al functional layer in the CCP-GMR film, the MR ratio of the CCP-GMR film can be enhanced.

D. Application of a Functional Layer for a TMR Film

The functional layer may be applied for a TMR film so as to enhance the MR ratio. The TMR film can be structured as substituting the spacer layer of metallic layer 15/current confining layer 16/metallic layer 17 with an insulating layer. In the TMR film, the insulating layer is made of e.g., MgO or $Al_2O_3$. In the TMR film, the spin polarizations of the pinned layer 14 and the free layer 18 are considered for the MR. The spin polarization is lowered by the diffusion of the excess oxygen of the MgO or $Al_2O_3$ into the pinned layer 14 and the free layer 18. In the TMR film, therefore, the prevention of the reduction in spin polarization due to the diffusion of the excess oxygen is effective for the enhancement of the MR ratio. In other words, if the functional layer is formed in the pinned layer 14, the free layer 18 and the cap layer 19 in the TMR element, the MR may be enhanced.

The TMR film containing the functional layer can be exemplified as follows: Ta 5 nm/Ru 2 nm/$Ir_{22}Mn_{78}$ 7 nm/$Co_{80}Fe_{20}$ 2 nm/Ru 0.9 nm/$(Co_{80}Fe_{20})_{80}B_{20}$ 2.4 nm/MgO 1.5 nm/$Co_{80}Fe_{20}$ 1 nm/Si 0.25 nm/$Ni_{85}Fe_{15}$ 3.5 nm/Cu 1 nm/Ta 2 nm/Ru 1 nm. In this film structure, the Si functional layer with a thickness of 0.25 nm is formed in the free layer of the TMR film.

The TMR film containing the functional layer can be exemplified as follows: Ta 5 nm/Ru 2 nm/$Ir_{22}Mn_{78}$ 7 nm/$Co_{80}Fe_{20}$ 2 nm/Ru 0.9 nm/$(Co_{80}Fe_{20})_{80}B_{20}$ 0.8 nm/Si 0.125 nm/$(Co_{80}Fe_{20})_{80}B_{20}$ 1.6 nm/MgO 1.5 nm/$Co_{80}Fe_{20}$ 1 nm/$Ni_{85}Fe_{15}$ 3.5 nm/Cu 1 nm/Ta 2 nm/Ru 1 nm. In this film structure, the Si functional layer with a thickness of 0.125 nm is formed in the pinned layer of the TMR film.

The TMR film containing the functional layer can be exemplified as follows: Ta 5 nm/Ru 2 nm/$Ir_{22}Mn_{78}$ 7 nm/$Co_{80}Fe_{20}$ 2 nm/Ru 0.9 nm/$(Co_{80}Fe_{20})_{80}B_{20}$ 2.4 nm/MgO 1.5 nm/$Co_{80}Fe_{20}$ 1 nm/$Ni_{85}Fe_{15}$ 3.5 nm/Si 0.5 nm/Cu 0.5 nm/Ta 2 nm/Ru 1 nm. In this film structure, the Si functional layer with a thickness of 0.5 nm is formed in the cap layer of the TMR film.

In these embodiments, the insulating spacer layer is made of MgO. If the insulating spacer layer is made of a material containing oxygen, the MR ratio may be increased by the formation of the functional layer. As the concrete material of the insulating layer, MgO, $Al_2O_3$ and $TiO_2$ may be employed.

(Apparatus to be Employed for Manufacturing a Magneto-Resistance Effect Element)

Figure 4:
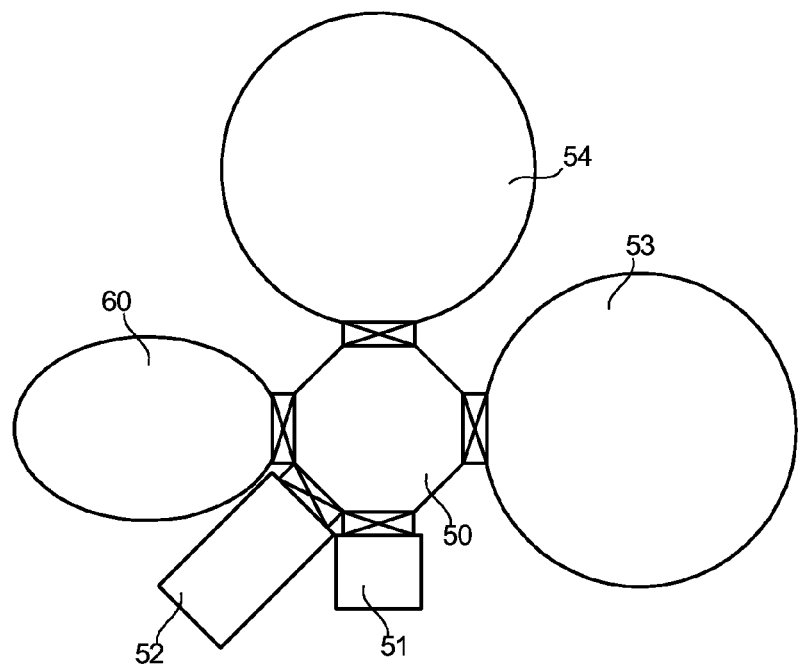
FIG. 4 is a schematic view illustrating a film forming apparatus for manufacturing the magneto-resistance effect element in FIG. 1.

FIG. 4 is a schematic view illustrating a film forming apparatus for manufacturing a magneto-resistance effect element in this embodiment.

As shown in FIG. 4, the transfer chamber (TC) 50 is disposed at the center of the apparatus such that the load lock chamber 51, the pre-cleaning chamber 52, the first metallic film-forming chamber (MC1) 53, the second metallic film-forming chamber (MC2) 54 and the oxide layer-nitride layer forming chamber (OC) 60 are disposed so as to be connected with the transfer chamber 50 via the gate valves, respectively. In the apparatus, the substrate on which various films are to be formed is transferred from one chamber from another chamber under the vacuum condition via the corresponding gate valve. Therefore, the surface of the substrate can be maintained clean.

The metallic film-forming chambers 53 and 54 include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

(Schematic Explanation of the Method for Manufacturing a Magneto-Resistance Effect Element)

Figure 5:
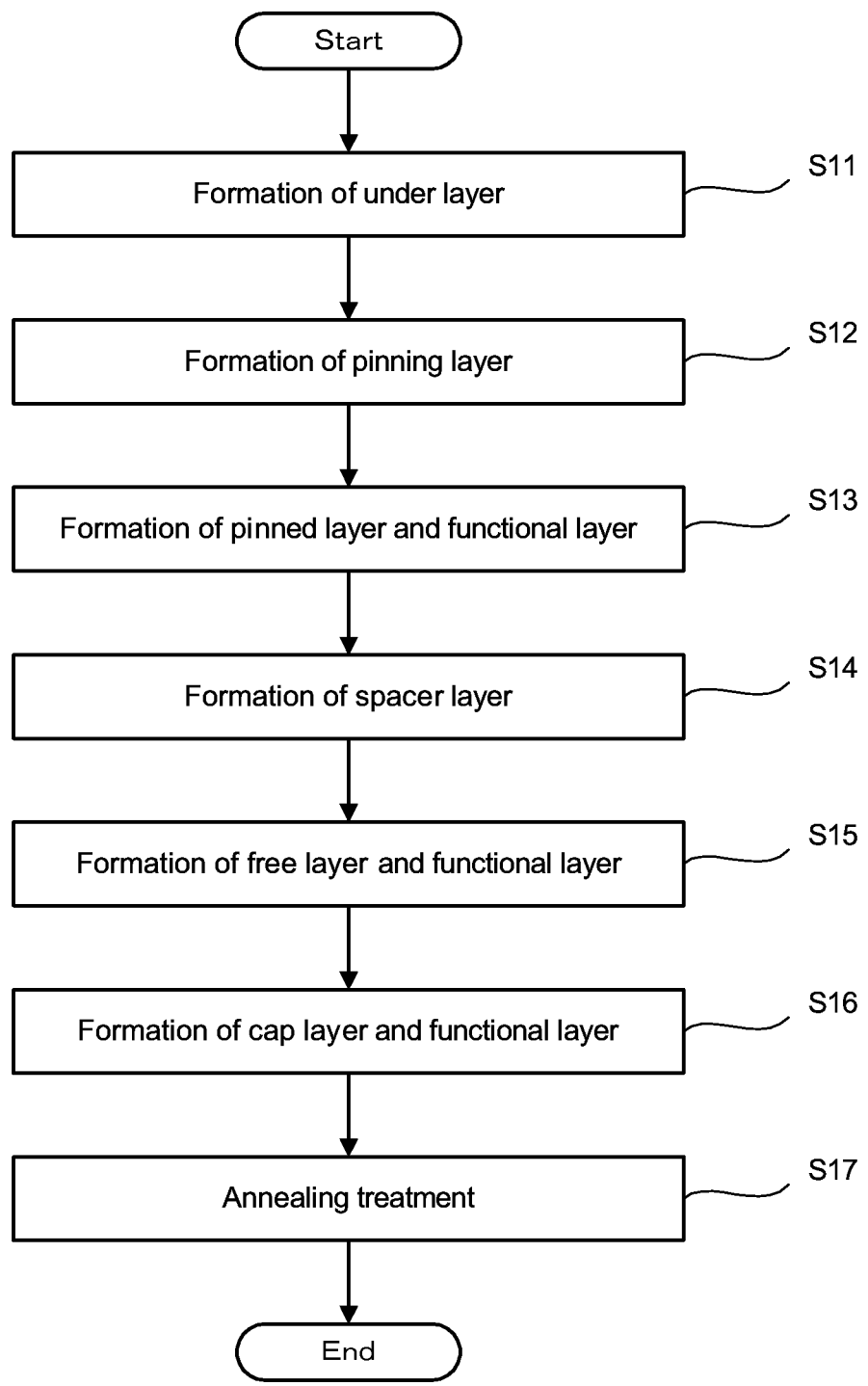
FIG. 5 is a flow chart in a method for manufacturing the magneto-resistance effect element in FIG. 1.

Hereinafter, the method for manufacturing a magneto-resistance effect element will be schematically described. FIG. 5 is a flowchart of the manufacturing method of the magneto-resistance effect element in this embodiment. First of all, on the substrate (not shown) are subsequently formed the bottom electrode 11, the underlayer 12, the pinning layer 13, the pinned layer 14, the bottom metallic layer 15, the spacer layer 16, the top metallic layer 17, the free layer 18, the cap layer 19 and the top electrode 20. A substrate is set into the load lock chamber 51 so that some metallic films are formed in the metallic film-forming chambers 53 and 54 and some oxide and/or nitride layers are formed in the oxide layer-nitride layer forming chamber 60. The ultimate vacuum of the metallic film-forming chambers 53 and 54 is preferably set to $1 \times 10^{-8}$ Torr or below, normally within a range of $5 \times 10^{-10}$ Torr-$5 \times 10^{-9}$ Torr. The ultimate vacuum of the transfer chamber 50 is set in the order of $10^{-9}$ Torr. The ultimate vacuum of the oxide layer-nitride layer forming chamber 60 is set to $8 \times 10^{-8}$ Torr or below. Then, the formation of each layer will be described.

(1) Formation of Underlayer 12 (Step S11)

The bottom electrode 11 is formed on the (not shown) substrate by means of micro-process in advance. Then, the underlayer 12 is formed as a layer of Ta 5 nm/Ru 2 nm on the bottom electrode 11. The Ta layer functions as the buffer layer 12a for relaxing the surface roughness of the bottom electrode 11. The Ru layer functions as the seed layer 12b for controlling the crystalline orientation and the crystal grain of the spin valve film to be formed thereon.

(2) Formation of Pinning Layer 13 (Step S12)

Then, the pinning layer 13 is formed on the underlayer 12. The pinning layer 13 may be made of an antiferromagnetic material such as PtMn, PdPtMn, IrMn, RuRhMn.

(3) Formation of Pinned Layer 14 (and Functional Layer 21) (Step S13)

Then, the pinned layer 14 is formed on the pinning layer 13. The pinned layer 14 may be formed as the synthetic pinned layer of the bottom pinned layer 141 ($Co_{90}Fe_{10}$)/the magnetic coupling layer 142 (Ru)/the top pinned layer 143 ($Co_{90}Fe_{10}$). In this case, by changing the material to be film-formed during the formation of the top pinned layer 143, the functional layer 21 can be formed. Concretely, if the material is switched to Si from $Co_{90}Fe_{10}$ and then, to $Co_{90}Fe_{10}$ from Si, the Si functional layer can be formed in the top pinned layer 143. If the material is switched to Si from $Co_{90}Fe_{10}$ and then, not to $Co_{90}Fe_{10}$ from Si, the Si functional layer can be formed on the top pinned layer 143.

(4) Formation of Spacer Layer 15 to 17 (Step S14)

Then, the spacer layer 15 to 17 containing the current confining layer 16 with the current-confined-path structure (CCP structure) is formed in the oxide layer-nitride layer forming chamber 60.

The current confining layer 16 can be formed below. In this embodiment, the current confining layer is configured such that the current confining path 162 made of crystalline Cu is formed in the insulating layer 161 made of amorphous $Al_2O_3$.

1) First of all, the bottom metallic layer 15 (e.g., made of Cu) as a supplier for the current confining path is formed on the top pinned layer 143 (or the functional layer), and the metallic layer (e.g., AlCu or Cu) to be converted into the corresponding insulating layer is formed on the bottom metallic layer 15. Then, the pre-treatment is performed onto the metallic layer under the irradiation of ion beams of inert gas such as Ar. The irradiation of ion beams corresponds to a pre-treatment for the formation of the insulating layer 161 and the current confining path 162, and is called as a "PIT (Pre-ion treatment)". According to the PIT, the elements of the bottom metallic layer are pumped up and infiltrated into the metallic layer. Therefore, the PIT is effective as an energy treatment.

2) Then, the metallic layer is oxidized by supplying oxidizing gas such as oxygen. According to the oxidizing treatment, the metallic layer is converted into the insulating layer 161 and the current confining path 162 is formed through the insulating layer 161, thereby completing the current confining layer 16. The oxidizing treatment can be performed by supplying the oxidizing gas (oxygen gas) under the irradiation of the ion beams. The treatment is called as an "IAO (Ion Assisted Oxidation)". According to the oxidizing treatment, the current confining layer 16 can be formed under the condition that the current confining path 162 of Cu is separated from the insulating layer 161 of $Al_2O_3$. The current confining layer 16 is formed by the difference in oxide formation energy between the elemental Al and the elemental Cu. Then, the top metallic layer 17 is formed of Cu on the current confining layer 16.

(5) Formation of Free Layer 18 (and Functional Layer) (Step S15)

The free layer 18 is formed on the top metallic layer 17. The free layer 18 may be structured as $Co_{90}Fe_{10}$ 1 nm/$Ni_{83}Fe_{17}$ 3.5 nm. In this case, by changing the material to be film-formed during the formation of the free layer 18, the functional layer 21 can be formed. Concretely, if the material is switched to Si from $Co_{90}Fe_{10}$ and then, to $Co_{90}Fe_{10}$ from Si, the Si functional layer can be formed in the top pinned layer 143. If the material is switched to Si from $Co_{90}Fe_{10}$ and then, not to $Co_{90}Fe_{10}$ from Si, the (6) Formation of Cap Layer 19 (and Functional Layer) and Top The cap layer 19 is formed as a multilayer of Cu 1 nm/Ru 10 nm on the free layer 18. In this case, by changing the material to be film-formed during the formation of the cap layer 19, the functional layer can be formed. Concretely, if the material is switched to Si from Cu and then, to Cu from Si, the Si functional layer 21 can be formed in the cap layer 19.

Then, the top electrode 20 is formed on the cap layer 19 so as to flow a current to the spin valve film in the direction perpendicular to the film surface thereof.

EXAMPLES

The present invention will be described in detail in view of Examples.

Example 1

In this embodiment, the film structure was configured below.

| | |
|---|---|
| Bottom electrode 11 | |
| Underlayer 12 | Ta 5 nm/Ru 2 nm |
| Pinning layer 13 | $Ir_{22}Mn_{78}$ 7 nm |
| Pinned layer 14 | $Co_{75}Fe_{25}$ 3.3 nm/Ru 0.9 nm/ $Fe_{50}Co_{50}$ 1 nm/Cu 0.25 nm × 2/$Fe_{50}Co_{50}$ 1 nm |
| Metallic layer 15 | Cu 0.6 nm |
| Current confining layer 16 | insulating layer 161 of $Al_2O_3$ and current confining path 162 of Cu |
| Metallic layer 17 | Cu 0.4 nm |
| Free layer 18 | described later |
| Cap layer 19 | Cu 1 nm/Ta 2 nm/Ru 15 nm |
| Top electrode 20 | |

In this embodiment, the characteristics of the magneto-resistance effect element was investigated with and without the functional layer in the free layer 18. Example 1 corresponds to the magneto-resistance effect element with the functional layer and Comparative Example 1 corresponds to the magneto-resistance effect element without the functional layer. The results are listed in Table 2.

TABLE 2

| | Free layer 18 | MR variation ratio [%] |
|---|---|---|
| Example 1 | $Co_{60}Fe_{40}$ [2 nm]/functional layer Si [0.25 nm]/$Ni_{83}Fe_{17}$ [3.5 nm] | 10.5 |
| Comparative Example 1 | $Co_{60}Fe_{40}$ [2 nm]/$Ni_{83}Fe_{17}$ [3.5 nm] | 9 |

The MR ratio of the magneto-resistance effect element in Example 1 is increased than the MR ratio of the magneto-resistance effect element in Comparative Example 1 by 1.5%. It is considered that the MR enhancement is originated from the capturing effect of the excess oxygen from the spacer layer ($Al_2O_3$) by the Si functional layer. According to the three dimensional atom probe, it is confirmed that the Si functional layer is formed in layered-shape in the free layer 18.

Example 2

In this embodiment, the functional layer was formed at various positions of the free layer 18 and the cap layer 19. The fundamental film structure will be listed below.

| | |
|---|---|
| Bottom electrode 11 | |
| Underlayer 12 | Ta 5 nm/Ru 2 nm |
| Pinning layer 13 | $Ir_{22}Mn_{78}$ 7 nm |
| Pinned layer 14 | $Co_{75}Fe_{25}$ 3.9 nm/Ru 0.9 nm/ $Fe_{50}Co_{50}$ 1.8 nm/Cu 0.25 nm/$Fe_{50}Co_{50}$ 1.8 nm |
| Metallic layer 15 | Cu 0.6 nm |
| Current confining layer 16 | insulating layer 161 of $Al_2O_3$ and current confining path 162 of Cu |
| Metallic layer 17 | Cu 0.4 nm |
| Free layer 18 | described later |
| Cap layer 19 | described later |
| Top electrode 20 | |

The thickness of the pinned layer 14 of the film structure in Example 2 is larger than the thickness of the pinned layer 14 of the film structure in Example 1. If the thickness of the pinned layer 14 is set larger, the crystallinity of the top pinned layer 143 is enhanced so as to enhance the MR through the enhancement of the spin dependent bulk scattering effect. The film structure of the free layer 18 and the cap layer 19 will be listed in Table 3. In this case, the magneto-resistance effect element was manufactured in the same manner as in Example 1. The results are listed in Table 3.

TABLE 3

| | Free layer 18 | Cap layer 19 | MR variation ratio [%] |
|---|---|---|---|
| Example 2A | $Co_{60}Fe_{40}$ [2 nm]/ functional layer Si [0.25 nm]/ $Ni_{83}Fe_{17}$ [3.5 nm] | Cu [1 nm]/Ta [2 nm]/Ru [15 nm] | 12.3 |
| Example 2B | $Co_{60}Fe_{40}$ [2 nm]/ $Ni_{83}Fe_{17}$ [1.5 nm]/ functional layer Si [0.25 nm]/ $Ni_{83}Fe_{17}$ [3.5 nm] | Cu [1 nm]/Ta [2 nm]/Ru [15 nm] | 12.1 |
| Example 2C | $Co_{60}Fe_{40}$ [2 nm]/ functional layer Si [0.25 nm]/ $Ni_{83}Fe_{17}$ [3.5 nm] | functional layer Si [0.25 nm]/ Cu [1 nm]/Ta [2 nm]/ Ru [15 nm] | 12.0 |
| Comparative Example 2 | $Co_{60}Fe_{40}$ [2 nm]/ $Ni_{83}Fe_{17}$ [3.5 nm] | Cu [1 nm]/Ta [2 nm]/Ru [15 nm] | 10.8 |

The MR ratios of the magneto-resistance effect films in Example 2A, Example 2B and Example 2C are enhanced by 1.5%, 1.3% and 1.2%, respectively, in comparison with Comparative Example 2. It is considered that the MR enhancement is originated from the capturing effect of the excess oxygen from the spacer layer ($Al_2O_3$) by the Si functional layer. According to the three dimensional atom probe, it is confirmed that the Si functional layer is formed in layered-shape in the free layer 18. The reason the MR in Comparative Example 2 is increased than the MR in Comparative Example 1 is originated from that the thickness of the pinned layer 14 in Comparative Example 2 is larger than the thickness of the pinned layer 14 in Comparative Example 1. As a result, it was confirmed that the MR can be enhanced by the formation of the functional layer in the free layer 18 and the cap layer 19. The MR enhancement degree in Examples 2B and 2C is smaller than the MR enhancement degree in Example 2A, which may result from that the capturing effect of the excess oxygen in Examples 2B and 2C is lower than the capturing effect of the excess oxygen in Examples 2A because in Examples 2B and 2C, the functional layer is formed remote from the spacer layer. According to the three dimensional atom probe, it is confirmed that the Si functional layer is formed in layered-shape in the free layer 18.

Example 3

In this embodiment, the functional layers were formed in the pinned layer 14 and the free layer 18. The fundamental film structure will be listed below.

| | |
|---|---|
| Bottom electrode 11 | |
| Underlayer 12 | Ta 5 nm/Ru 2 nm |
| Pinning layer 13 | $Ir_{22}Mn_{78}$ 7 nm |
| Pinned layer 14 | described later |
| Metallic layer 15 | Cu 0.6 nm |
| Current confining layer 16 | insulating layer 161 of $Al_2O_3$ and current confining path 162 of Cu |
| Metallic layer 17 | Cu 0.4 nm |
| Free layer 18 | described later |
| Cap layer 19 | Cu 1 nm/Ta 2 nm/Ru 15 nm |
| Top electrode 20 | |

The film structure of the pinned layer 14 and the free layer 18 will be listed in Table 4. In Example 3, the Si functional layer is formed in the top pinned layer 143, which is different from Example 2. The results are listed in Table 4.

TABLE 4

| | Pinned layer 14 | Free layer 14 | MR variation ratio [%] |
|---|---|---|---|
| Example 3 | $Co_{75}Fe_{25}$ [3.9 nm]/Ru [0.9 nm]/$Fe_{50}Co_{50}$ [0.6 nm]/functional layer Si [0.25 nm]/$Fe_{50}Co_{50}$ [1.2 nm]/Cu [0.25 nm]/$Fe_{50}Co_{50}$ [1.8 nm] | $Co_{60}Fe_{40}$ [2 nm]/functional layer Si [0.25 nm]/$Ni_{83}Fe_{17}$ [3.5 nm] | 12.8 |
| Example 2A | $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm] | $Co_{60}Fe_{40}$ [2 nm]/functional layer Si [0.25 nm]/$Ni_{83}Fe_{17}$ [3.5 nm] | 12.3 |
| Comparative Example 2 | $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm] | $Co_{60}Fe_{40}$ [2 nm]/$Ni_{83}Fe_{17}$ [3.5 nm] | 10.8 |

The MR ratio of the magneto-resistance effect film in Example 3 is enhanced by 2.0%, in comparison with Comparative Example 2, and is enhanced by 0.5%, in comparison with Example 2A. It is confirmed that the MR ratio of the CCP-GMR film can be enhanced by the formation of the Si functional layer into pinned layer 14. According to the three dimensional atom probe, it is confirmed that the Si functional layer is formed in layered-shape in the free layer 18.

Example 4

In this embodiment, the thickness of the functional layer was varied. The fundamental film structure will be listed below.

Bottom electrode 11
Underlayer 12        Ta 5 nm/Ru 2 nm
Pinning layer 13     $Ir_{22}Mn_{78}$ 7 nm
Pinned layer 14      $Co_{75}Fe_{25}$ 3.9 nm/Ru 0.9 nm/
                     $Fe_{50}Co_{50}$ 1.8 nm/Cu 0.25 nm/$Fe_{50}Co_{50}$
                     1.8 nm
Metallic layer 15    Cu 0.6 nm
Current confining layer 16   insulating layer 161 of
                     $Al_2O_3$ and current confining path 162 of Cu
Metallic layer 17    Cu 0.4 nm
Free layer 18        described later
Cap layer 19         Cu 1 nm/Ta 2 nm/Ru 15 nm
Top electrode 20

The results are listed in Table 5.

TABLE 5

| | Free layer 18 | MR variation ratio [%] |
|---|---|---|
| Example 4 | $Co_{60}Fe_{40}$ [2 nm]/functional layer Si [0.5 nm]/$Ni_{83}Fe_{17}$ [3.5 nm] | 12.3 |
| Example 2A | $Co_{60}Fe_{40}$ [2 nm]/functional layer Si [0.25 nm]/$Ni_{83}Fe_{17}$ [3.5 nm] | 12.3 |
| Comparative Example 2 | $Co_{60}Fe_{40}$ [2 nm]/$Ni_{83}Fe_{17}$ [3.5 nm] | 10.8 |

The MR ratio of the magneto-resistance effect film in Example 4 is enhanced by 1.50, in comparison with Comparative Example 2, which corresponds to the enhancement degree of the MR ratio in the case of Example 1 and Comparative Example 1. Herein, the thickness of the Si functional layer in Example 4 is set larger than the thickness of the Si functional layer in Example 1. It is considered that the MR enhancement is originated from the capturing effect of the excess oxygen from the spacer layer ($Al_2O_3$) by the Si functional layer. According to the three dimensional atom probe, it is confirmed that the Si functional layer is formed in layered-shape in the free layer 18.

Example 5

In this embodiment, the functional layer was formed in the free layers 18, each free layer having the respective different film structure from another one. The fundamental film structure will be listed below.

Bottom electrode 11
Underlayer 12        Ta 5 nm/Ru 2 nm
Pinning layer 13     $Ir_{22}Mn_{78}$ 7 nm
Pinned layer 14      $Co_{75}Fe_{25}$ 3.9 nm/Ru 0.9 nm/
                     $Fe_{50}Co_{50}$ 1.8 nm/Cu 0.25 nm/$Fe_{50}Co_{50}$
                     1.8 nm
Metallic layer 15    Cu 0.6 nm
Current confining layer 16   insulating layer 161 of
                     $Al_2O_3$ and current confining path 162 of Cu
Metallic layer 17    Cu 0.4 nm
Free layer 18        described later
Cap layer 19         Cu 1 nm/Ta 2 nm/Ru 15 nm
Top electrode 20

The film structure of each free layer 18 is listed in Table 6. In Comparative Examples 3, 2, 4, the composition of the FeCo alloy of the free layer 18 is varied at the interface between the free layer 18 and the spacer layer. The Fe composition is set to 10 at %, 40 at % and 50 at % in Comparative Examples 3, 2, 4, respectively. In Examples 5A, 2A, 5B, the Si functional layer is formed in the corresponding fundamental film structures in Comparative Examples 3, 2, 4, respectively. The results are listed in Table 6. In this case, the MR enhancement can be determined dependent on the film structure of the free layer in which the functional layer is formed.

TABLE 6

| | Free layer 18 | MR variation ratio [%] |
|---|---|---|
| Example 5A | $Co_{50}Fe_{50}$ [2 nm]/functional layer Si [0.25 nm]/$Ni_{83}Fe_{17}$ [3.5 nm] | 12.8 |
| Example 2A | $Co_{60}Fe_{40}$ [2 nm]/functional layer Si [0.25 nm]/$Ni_{83}Fe_{17}$ [3.5 nm] | 12.3 |
| Example 5B | $Co_{90}Fe_{10}$ [2 nm]/functional layer Si [0.25 nm]/$Ni_{83}Fe_{17}$ [3.5 nm] | 10.3 |
| Comparative Example 3 | $Co_{50}Fe_{50}$ [2 nm]/$Ni_{83}Fe_{17}$ [3.5 nm] | 10.8 |
| Comparative Example 2 | $Co_{60}Fe_{40}$ [2 nm]/$Ni_{83}Fe_{17}$ [3.5 nm] | 10.8 |
| Comparative Example 4 | $Co_{90}Fe_{10}$ [2 nm]/$Ni_{83}Fe_{17}$ [3.5 nm] | 9.8 |

The MR ratio of the magneto-resistance effect film in Example 5A is enhanced by 2.2%, in comparison with Comparative Example 3. It is considered that the MR enhancement is originated from the capturing effect of the excess oxygen from the spacer layer ($Al_2O_3$) by the Si functional layer. In view of the composition of the FeCo alloy of the free layer 14 in addition to the formation of the Si functional layer for the MR enhancement, the MR ratio is increased by 0.5% at the Fe composition of 10 at. % at the interface between the free layer 18 and the spacer, and by 1.5% at the Fe composition of 40 at. % thereat, and by 2.2% at the Fe composition of 50 at. % thereat. It is apparent, therefore, that the MR ratio due to the functional layer is increased as the Fe composition is increased.

The reason the MR ratio is increased as the Fe composition is increased can be considered as follows. The oxide formation energy of Fe is lower than Co referring to Table 1 so that the elemental Fe is likely to be oxidized than Co. As a result, when the free layer 18 is made of a material with Fe-rich composition, the free layer 18 are likely to be oxidized from the excess oxygen of the spacer layer. Therefore, the MR ratio can be easily increased by the capturing effect of excess oxygen due to the formation of the Si functional layer. According to the three dimensional atom probe, it is confirmed that the Si functional (Application of Magneto-Resistance Effect Element)

The application of the magneto-resistance effect element according to this embodiment will be described hereinafter, In view of high density recording, the element resistance RA is set preferably to 500 mΩμm$^2$ or below, more preferably to 300 mΩμm$^2$ or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 μm$^2$ or below in view of the appropriate element resistance, and to 0.02 μm$^2$ or below in view of the recording density of 200 Gbpsi or over.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 μm$^2$ or below in view of the appropriate element resistance.

Figure 6:
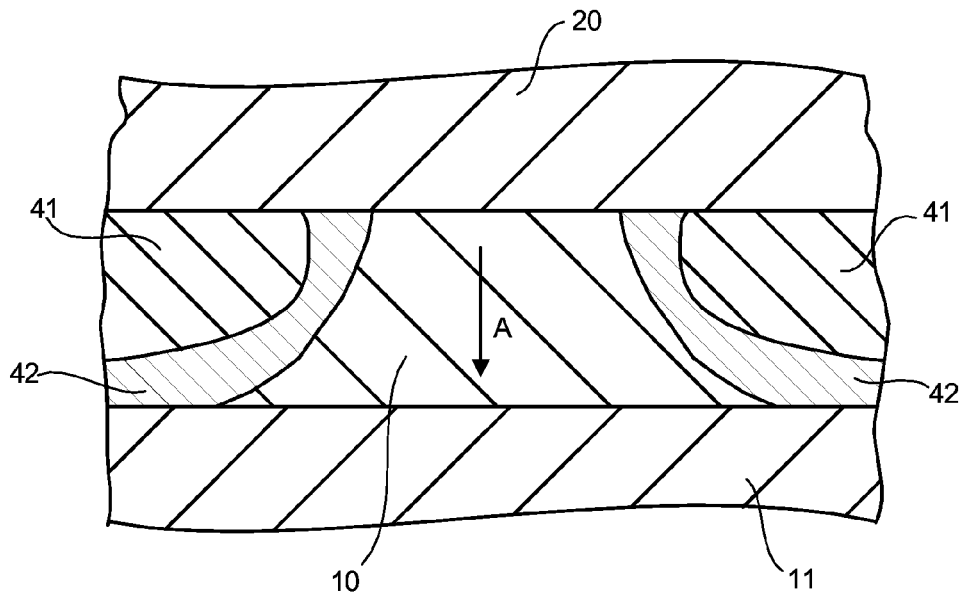
FIG. 6 is a cross sectional view showing the state where the magneto-resistance effect element in FIG. 1 is incorporated in a magnetic head.
Figure 7:
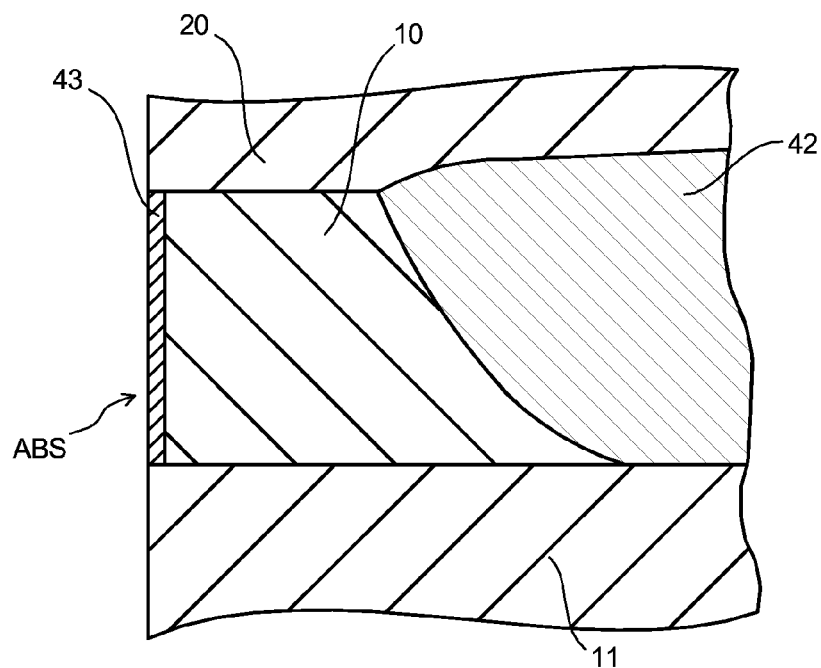
FIG. 7 is another cross sectional view showing the state where the magneto-resistance effect element in FIG. 1 is incorporated in a magnetic head.

Referring to FIGS. 6 and 7, since the smallest area of the spin valve film 10 corresponds to the contacting area with the top electrode 20 as apparent from FIG. 6, the width of the smallest area can be considered as a track width Tw. Then, since the smallest area of the spin valve film. 10 in MR height direction also corresponds to the contacting area with the top electrode 20 as apparent from FIG. 7, the width of the smallest are can be considered as a height length D. In this case, the effective area A can be calculated on the equation of A=Tw×D.

In the magneto-resistance effect element according to this embodiment, the resistance R between the electrodes can be reduced to 100Ω or below, which corresponds to the resistance between the electrode pads in the reproducing head attached to the forefront of a head gimbal assembly (HGA), for example.

It is desired that the magneto-resistance effect element is structured in fcc (111) orientation when the pinned layer 14 or the free layer 18 has the fcc-structure. It is also desired that the magneto-resistance effect element is structured in bcc (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element according to this embodiment is preferably 4.5 degrees or below, more preferably 3.5 degrees or below and particularly 3.0 degree or below in view of the dispersion of orientation. The crystalline orientation can be measured from the FWHM of X-ray rocking curve obtained from the 8-28 measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/current confining layer 16/free layer 18, the dispersion in crystalline orientation can be obtained between the antiferromagnetic film and the pinned layer 14/current confining layer 16/free layer 18. For example, the lattice spacing of the PtMn antiferromagnetic layer is often different from the lattice spacing of the pinned layer 14/Current confining layer 16/free layer 18. In this point of view, since the PtMn layer is formed thicker, the PtMn layer is suitable for the measurement in dispersion of the crystal orientation. With the pinned layer 14/current confining layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

(Magnetic Head)

FIGS. 6 and 7 are cross sectional views showing the state where the magneto-resistance effect element according to this embodiment is incorporated in a magnetic head. FIG. 6 is a cross sectional view showing the magneto-resistance effect element, taken on the surface almost parallel to the ABS (air bearing surface) opposite to a (not shown) magnetic recording medium. FIG. 7 is a cross sectional view showing the magneto-resistance effect element, taken on the surface almost perpendicular to the ABS.

The magnetic head shown in FIGS. 6 and 7 has a so-called hard abutted structure. The magneto-resistance effect film 10 is the CCP-CPP film as described above. The bottom electrode 11 and the top electrode 20 are provided on the top surface and the bottom surface of the magneto-resistance effect film 10, respectively. In FIG. 6, the biasing magnetic applying films 41 and the insulating films 42 are formed at the both sides of the magneto-resistance effect film 10. In FIG. 7, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented.

Since the S/N ratio of the magneto-resistance effect film 10 is enhanced, the magnetic head including the magneto-resistance effect film 10 can realize the high sensitive magnetic reproduction.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 8:
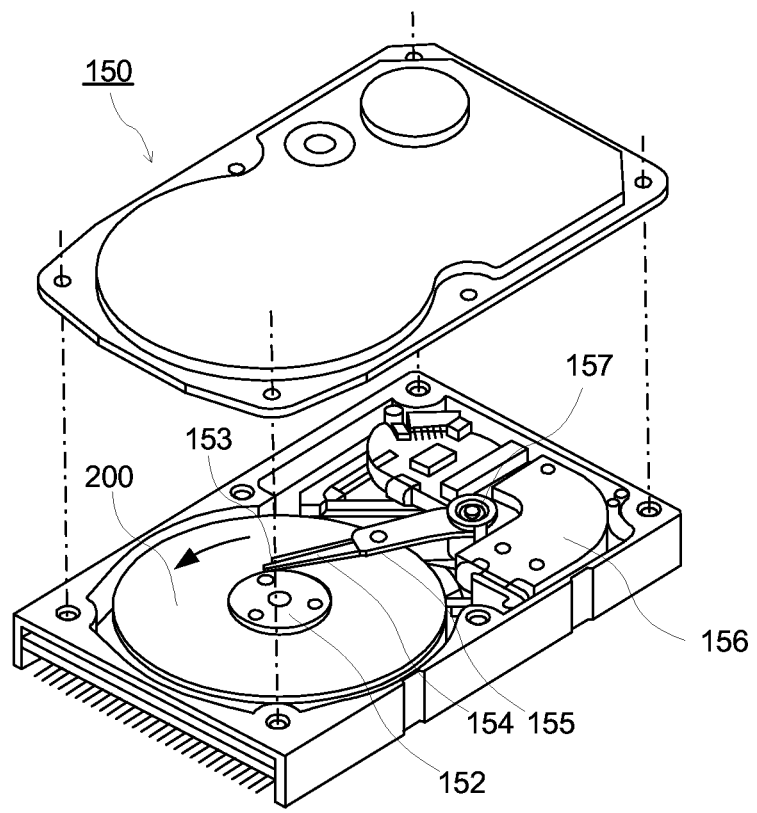
FIG. 8 is a perspective view illustrating an essential part of a magnetic recording/reproducing device according to the present invention.

FIG. 8 is a perspective view illustrating the schematic structure of the magnetic recording/reproducing device. The magnetic recording/reproducing device 150 illustrated in FIG. 8 constitutes a rotary actuator type magnetic recording/reproducing device. In FIG. 8, a magnetic recording disk 200 is mounted to a spindle 152 to be turned in the direction designated by the arrow A by a motor (not shown) which is driven in response to control signals from a drive unit controller (not shown). In FIG. 8, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 9:
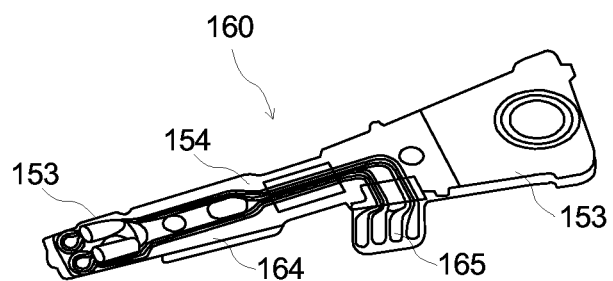
FIG. 9 is an enlarged perspective view illustrating the magnetic head assembly of the magnetic recording/reproducing device.

FIG. 9 is an enlarged perspective view illustrating a portion of the magnetic head assembly positioned at the tip side thereof from the actuator arm 155, as viewed from the side of the magnetic recording disk 200. As illustrated in FIG. 9, the magnetic head assembly 160 has the actuator arm 155 with the bobbin portion supporting the driving coil and the like. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 8 and 9, since the magneto-resistance effect element as described in the above embodiments is installed, the information magnetically recorded in the magnetic recording disk 200 can be read out properly.

(Magnetic Memory)

The magneto-resistance effect element as described above can constitute a magnetic memory such as a magnetic random access memory (MRAM) where memory cells are arranged in matrix.

Figure 10:
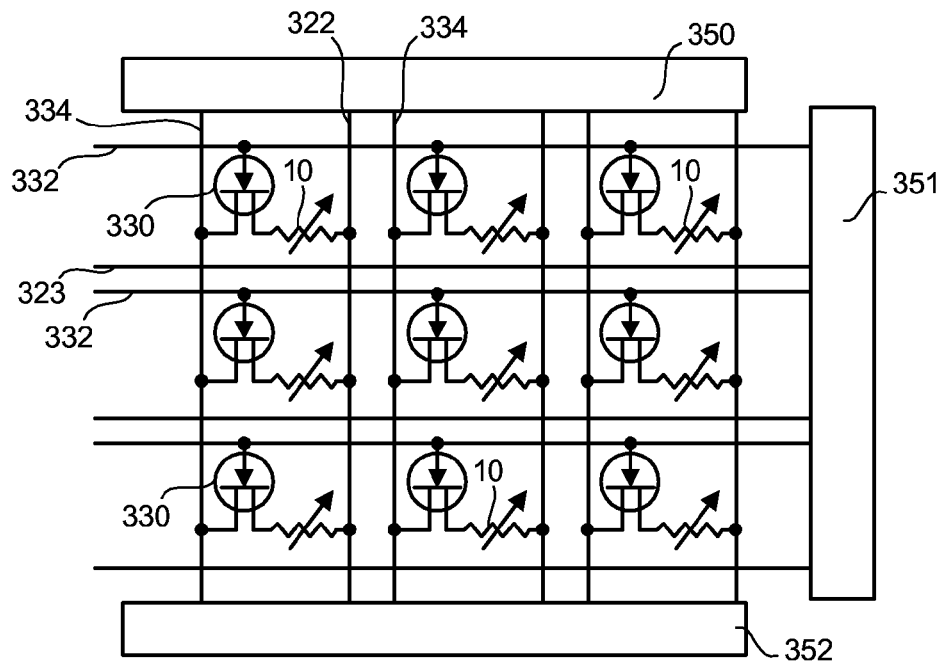
FIG. 10 is a view illustrating a magnetic memory matrix according to the present invention.

FIG. 10 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, a writing current is flowed in a specific write word line 323 and a bit line 322 to generate a magnetic field for writing.

Figure 11:
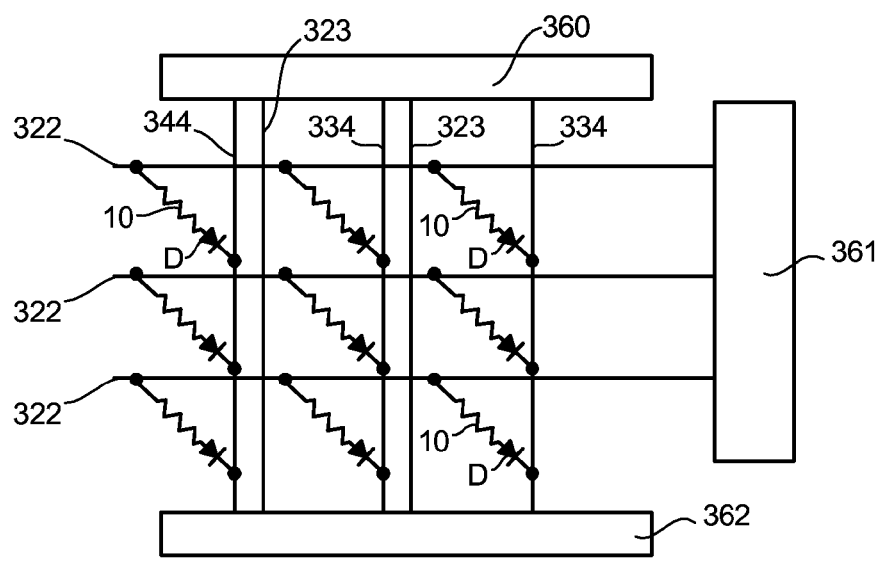
FIG. 11 is a view illustrating another magnetic memory matrix according to the present invention.

FIG. 11 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 12:
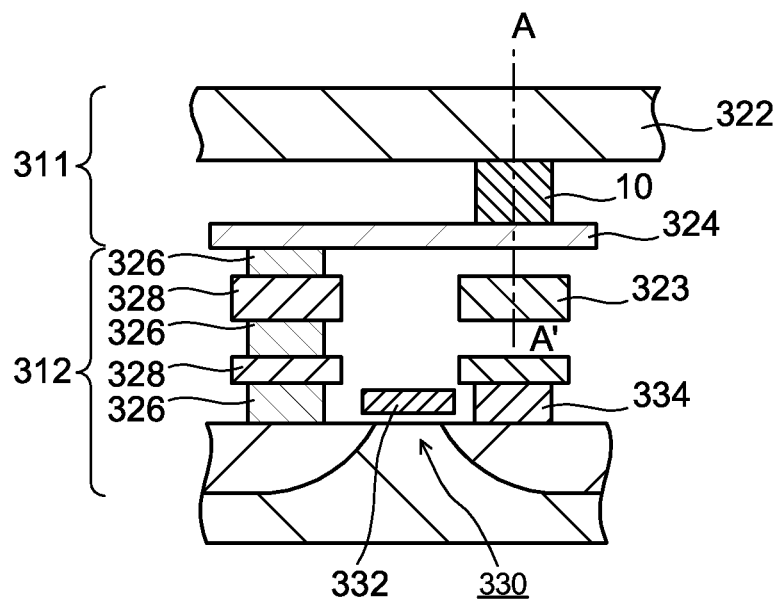
FIG. 12 is a cross sectional view illustrating an essential part of the magnetic memory.
Figure 13:
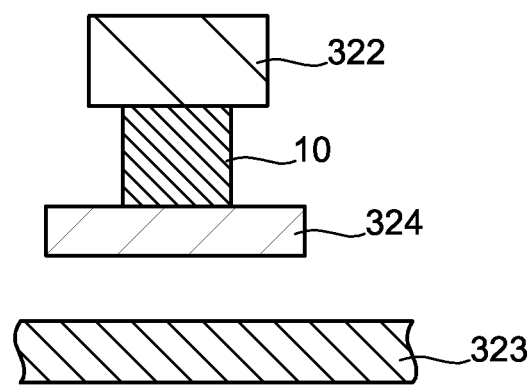
FIG. 13 is a cross sectional view of the magnetic memory illustrated in FIG. 12, taken on line "A-A'".

FIG. 12 is a cross sectional view illustrating a substantial portion of the magnetic memory in an embodiment according to the present invention. FIG. 13 is a cross sectional view of the magnetic memory illustrated in FIG. 12, taken on line "A-A'". The configuration shown in these drawings corresponds to a 1-bit memory cell included in the magnetic memory shown in FIG. 10 or FIG. 11. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confining path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

Another Embodiment

Although the present invention was described in detail with reference to the above examples, this invention is not limited to the above disclosure and every kind of variation and modification may be made without departing from the scope of the present invention.

The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element according to the present invention can be obtained so as to exhibit the same effect/function as described above.

When the magneto-resistance effect element is applied for a reproducing magnetic head, the detecting resolution of the magnetic head can be defined by applying magnetic shielding for the upper side and the lower side of the magneto-resistance effect element. Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

What is claimed is:

1. A magneto-resistance effect element, comprising:
 a bottom electrode;
 a first fixed magnetization layer formed on or above the bottom electrode, the first fixed magnetization layer having a magnetization substantially fixed in one direction;
 a magnetic coupling layer formed on the first fixed magnetization layer;
 a second fixed magnetization layer formed on the magnetic coupling layer, the second fixed magnetization layer having a magnetization substantially fixed in one direction;
 a free magnetization layer formed opposite to the second fixed magnetization layer, the free magnetization layer having a magnetization rotated in accordance with an external magnetic field;
 a spacer layer disposed between the second fixed magnetization layer and the free magnetization layer, the spacer layer including a current confining layer, the current confining layer having an insulating layer and a conductor to pass a current through the insulating layer in a thickness direction thereof, the insulating layer including oxide, nitride or oxynitride;
 a functional layer formed in or on the second fixed magnetization layer, the functional layer containing at least one element selected from the group consisting of Si, Mg, B, and Al; and
 a top electrode formed on or above the free magnetization layer, the top electrode being configured to pass electric current in combination with the bottom electrode.

2. The magneto-resistance effect element as set forth in claim 1,
 wherein the functional layer contains Si.

3. The magneto-resistance effect element as set forth in claim 1,
 wherein a thickness of the functional layer is within 0.1 to 10 nm.

4. The magneto-resistance effect element as set forth in claim 1,
 wherein the spacer layer includes a metallic layer formed so as to be adjacent to the current confining layer and at least one of the second fixed magnetization layer and the free magnetization layer.

5. The magneto-resistance effect element as set forth in claim 4,
 wherein the metallic layer includes at least one element selected from the group consisting of Cu, Ag, and Au.

6. The magneto-resistance effect element as set forth in claim 1,
 wherein the conductor of the current confining layer mainly contains at least one element selected from the group consisting of Cu, Ag, and Au.

7. The magneto-resistance effect element as set forth in claim 1,
 wherein at least one of the second fixed magnetization layer and/or the free magnetization layer contains Fe.

8. The magneto-resistance effect element as set forth in claim 7,
 wherein an Fe composition in a region of the second fixed magnetization layer and/or the free magnetization layer remote from the spacer layer by 1 nm or less is set to 10% or more.

9. The magneto-resistance effect element as set forth in claim 7,
 wherein an Fe composition in a region of the second fixed magnetization layer and/or the free magnetization layer remote from the spacer layer by 1 nm or less is set to 40% or more.

10. A magnetic head, comprising a magneto-resistance effect element as set forth in claim 1.

11. A magnetic recording/reproducing device, comprising the magnetic head as set forth in claim 10 and a magnetic recording medium.

12. A magnetic memory, comprising a magneto-resistance effect element as set forth in claim 1.

13. A magneto-resistance effect element, comprising:
 a bottom electrode;
 a first fixed magnetization layer formed on or above the bottom electrode, the first fixed magnetization layer having a magnetization substantially fixed in one direction;
 a magnetic coupling layer formed on the first fixed magnetization layer;
 a second fixed magnetization layer formed on the magnetic coupling layer, the second fixed magnetization layer having a magnetization substantially fixed in one direction;
 a spacer layer including a first metallic layer, a current confining layer, and a second metallic layer subsequently stacked therein on the second fixed magnetization layer,
  the first metallic layer containing at least one element selected from the group consisting of Cu, Ag, and Au,
  the current confining layer having an insulating layer and a conductor to pass a current through the insulating layer in a thickness direction thereof, the insulating layer including oxide, nitride or oxynitride, the conductor containing at least one element selected from the group consisting of Cu, Al, and Au,
the second metallic layer containing at least one element selected from the group consisting of Cu, Ag, and Au;
a free magnetization layer formed on the spacer layer, the free magnetization layer having a magnetization rotated in accordance with an external magnetic field;
a functional layer formed in or on the second fixed magnetization layer, the functional layer containing at least one element selected from the group consisting of Si, Mg, B, and Al; and
a top electrode formed on or above the free magnetization layer, the top electrode being configured to pass electric current in combination with the bottom electrode,
wherein an Fe composition in a region of the second fixed magnetization layer and/or the free magnetization layer remote from the spacer layer by 1 nm or less is set to 10% or more.

14. The magneto-resistance effect element as set forth in claim 13,
wherein the Fe composition in the region of the second fixed magnetization layer and/or the free magnetization layer remote from the spacer layer by 1 nm or less is set to 40% or more.

15. A magneto-resistance effect element, comprising:
a bottom electrode;
a first fixed magnetization layer formed on or above the bottom electrode, the first fixed magnetization having a magnetization substantially fixed in one direction;
a magnetic coupling layer formed on the first fixed magnetization layer;
a second fixed magnetization layer formed on the magnetic coupling layer, the second fixed magnetization layer having a magnetization substantially fixed in one direction;
a free magnetization layer formed opposite to the second fixed magnetization layer, the free magnetization layer having a magnetization rotated in accordance with an external magnetic field;
an insulating spacer layer disposed between the second fixed magnetization layer and the free magnetization layer, the insulating spacer layer passing a tunnel current therethrough;
a functional layer formed in or on the second fixed magnetization layer, the functional layer containing at least one element selected from the group consisting of Si, Mg, B, and Al; and
a top electrode formed on or above the free magnetization layer, the top electrode being configured to pass electric current in combination with the bottom electrode.

16. The magneto-resistance effect element as set forth in claim 15,
wherein a thickness of the functional layer is within 0.1 to 10 nm.

17. The magneto-resistance effect element as set forth in claim 16,
wherein at least one of the second fixed magnetization layer and/or the free magnetization layer contains Fe.

18. The magneto-resistance effect element as set forth in claim 17,
wherein an Fe composition in a region of the second fixed magnetization layer and/or the free magnetization layer remote from the spacer layer by 1 nm or less is set to 10% or more.

19. The magneto-resistance effect element as set forth in claim 17,
wherein an Fe composition in a region of the second fixed magnetization layer and/or the free magnetization layer remote from the spacer layer by 1 nm or less is set to 40% or more.

* * * * *